(12) United States Patent
Ding et al.

(10) Patent No.: US 11,592,506 B2
(45) Date of Patent: Feb. 28, 2023

(54) SYSTEM AND METHOD FOR MAGNETIC RESONANCE IMAGING

(71) Applicant: SHANGHAI UNITED IMAGING HEALTHCARE CO., LTD., Shanghai (CN)

(72) Inventors: Yu Ding, Houston, TX (US); Jingyuan Lyu, Houston, TX (US); Qi Liu, Houston, TX (US); Jian Xu, Houston, TX (US)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 382 days.

(21) Appl. No.: 16/813,881

(22) Filed: Mar. 10, 2020

(65) Prior Publication Data
US 2020/0309883 A1   Oct. 1, 2020

(30) Foreign Application Priority Data
Mar. 26, 2019   (CN) .......................... 201910232085.9

(51) Int. Cl.
*G01V 3/00* (2006.01)
*G01R 33/48* (2006.01)
(Continued)

(52) U.S. Cl.
CPC ..... *G01R 33/4826* (2013.01); *G01R 33/5619* (2013.01); *G01R 33/583* (2013.01);
(Continued)

(58) Field of Classification Search
CPC ............. G01R 33/3415; G01R 33/543; G01R 33/5659; G01R 33/36; A61B 5/055
(Continued)

(56) References Cited

U.S. PATENT DOCUMENTS

| 9,921,285 B2 | 3/2018 | Otazo et al. |
| 2005/0264287 A1 | 12/2005 | Griswold et al. |

(Continued)

FOREIGN PATENT DOCUMENTS

| CN | 104965184 A | 10/2015 |
| JP | 2017082064 A * | 5/2017 |
| WO | 2017007279 A1 | 1/2017 |

OTHER PUBLICATIONS

Kai Tobias Bolck et al., Towards Routine Clinical use of Radial Stack-of-Stars 3D Gradient-Echo Sequences for Reducing Motion Sensitivity, Journal of the Korean Society of Magnetic Resonance in Medicine, 18(2): 87-106, 2014.
(Continued)

*Primary Examiner* — Walter L Lindsay, Jr.
*Assistant Examiner* — Frederick Wenderoth
(74) *Attorney, Agent, or Firm* — Metis IP LLC

(57) ABSTRACT

The present disclosure provides a system and method for magnetic resonance imaging. The method may include obtaining first k-space data collected from a subject in a non-Cartesian sampling manner. The method may also include generating second k-space data by regridding the first k-space data. The method may further include generating third k-space data by calibrating the second k-space data, wherein a calibrated field of view (FOV) corresponding to the third k-space data is constituted by a central portion of an intermediate FOV corresponding to the second k-space data. The method may still further include reconstructing, using at least one of a compressed sensing algorithm or a parallel imaging algorithm, a magnetic resonance (MR) image of the subject based at least in part on the third k-space data.

19 Claims, 14 Drawing Sheets

(51) Int. Cl.
  *G01R 33/561* (2006.01)
  *G01R 33/58* (2006.01)
  *G06T 7/00* (2017.01)

(52) U.S. Cl.
  CPC .. *G06T 7/0012* (2013.01); *G06T 2207/10088* (2013.01); *G06T 2207/30004* (2013.01); *G06T 2210/12* (2013.01); *G06T 2210/41* (2013.01); *G06T 2210/52* (2013.01)

(58) Field of Classification Search
  USPC .......................................................... 324/309
  See application file for complete search history.

(56) References Cited

U.S. PATENT DOCUMENTS

| | | | |
|---|---|---|---|
| 2006/0264735 A1 | 11/2006 | Stemmer | |
| 2008/0122805 A1* | 5/2008 | Smith | A63F 13/2145 345/175 |
| 2013/0123611 A1* | 5/2013 | Riederer | G01R 33/5635 600/419 |
| 2013/0289912 A1* | 10/2013 | Liu | G01R 33/243 702/65 |
| 2015/0168522 A1* | 6/2015 | Gulaka | G01R 33/4818 324/309 |
| 2015/0369893 A1 | 12/2015 | Takeshima | |
| 2016/0274209 A1 | 9/2016 | Dannels | |

OTHER PUBLICATIONS

Robert Grimm et al., Golden-Angle Radial Sparse Parallel MRI: Combination of Compressed Sensing, Parallel Imaging, and Golden-Angle Radial Sampling for Fast and Flexible Dynamic Volumetric MRI, Magnetic Resonance in Medicine, 72:707-717, 2014.

Thomas Benkert et al., Optimization and Validation of Accelerated Golden-Angle Radial Sparse MRI Reconstruction with Self-Calibrating GRAPPA Operator Gridding, Magnetic Resonance in Medicine, 80(1): 286-293, 2018.

Jeffrey A. Fessler et al., Nonuniform Fast Fourier Transforms Using Min-Max Interpolation, IEEE Transactions on Signal Processing, 51(2): 560-574, 2003.

Philip J. Beatty et al., Rapid Gridding Reconstruction with a Minimal Oversampling Ratio, IEEE Transactions on Medical Imaging, 24(6):799-808, 2005.

First Office Action in Chinese Application No. 201910232085.9 dated Dec. 1, 2021, 14 pages.

* cited by examiner

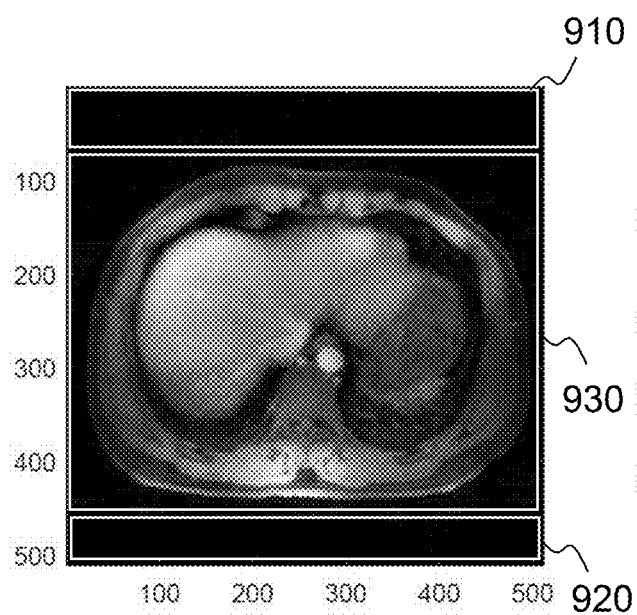
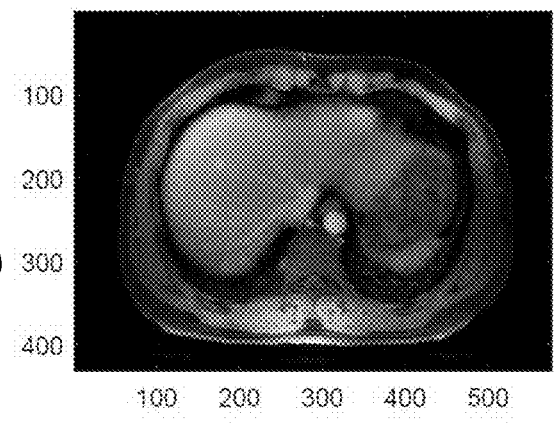
900
FIG. 9(a)
950
FIG. 9(b)

SYSTEM AND METHOD FOR MAGNETIC RESONANCE IMAGING

CROSS-REFERENCE TO RELATED APPLICATIONS

This application claims priority to Chinese Application No. 201910232085.9, filed on Mar. 26, 2019, the content of which is hereby incorporated by reference.

TECHNICAL FIELD

The present disclosure generally relates to medical imaging, and more particularly, relates to systems and methods for magnetic resonance (MR) imaging.

BACKGROUND

Magnetic resonance (MR) imaging is a noninvasive imaging technique, which is widely used in medical diagnoses. During an MR imaging process, MR data is sampled and filled into a k-space, and data in the k-space is used to reconstruct an MR image. Cartesian sampling manners or non-Cartesian sampling manners (e.g., spiral sampling or radial sampling) can be used to sample the MR data. The non-Cartesian sampling manners have advantages such as high imaging speed, being insensitive to motion and flow, etc. However, the MR data sampled in a non-Cartesian sampling manner has a large data volume, thereby requiring a large amount of computation in the image reconstruction process. Thus, it is desirable to develop systems and methods for MR imaging more efficiently.

SUMMARY

According to one aspect of the present disclosure, a magnetic resonance (MR) imaging system is provided. The system may include at least one storage device including a set of instructions, and at least one processor configured to communicate with the at least one storage device. When executing the set of instructions, the at least one processor may be configured to direct the system to perform the following operations. The following operations may include obtaining first k-space data collected by a magnetic resonance (MR) scanner from a subject in a non-Cartesian sampling manner; generating second k-space data by regridding the first k-space data; generating third k-space data by calibrating the second k-space data, wherein a calibrated field of view (FOV) corresponding to the third k-space data is constituted by a central portion of an intermediate FOV corresponding to the second k-space data; and reconstructing, using at least one of a compressed sensing algorithm or a parallel imaging algorithm, a magnetic resonance (MR) image of the subject based at least in part on the third k-space data.

According to another aspect of the present disclosure, a method implemented on a computing device having a processor and a computer-readable storage device may be provided. The method may include obtaining first k-space data collected by a magnetic resonance (MR) scanner from a subject in a non-Cartesian sampling manner; generating second k-space data by regridding the first k-space data; generating third k-space data by calibrating the second k-space data, wherein a calibrated field of view (FOV) corresponding to the third k-space data is constituted by a central portion of an intermediate FOV corresponding to the second k-space data; and reconstructing, using at least one of a compressed sensing algorithm or a parallel imaging algorithm, a magnetic resonance (MR) image of the subject based at least in part on the third k-space data.

According to a further aspect of the present disclosure, a non-transitory computer-readable storage medium including instructions may be provided. When the non-transitory computer-readable storage medium is accessed by at least one processor of a system, the system may be caused to perform a method. The method may include obtaining first k-space data collected by a magnetic resonance (MR) scanner from a subject in a non-Cartesian sampling manner; generating second k-space data by regridding the first k-space data; generating third k-space data by calibrating the second k-space data, wherein a calibrated field of view (FOV) corresponding to the third k-space data is constituted by a central portion of an intermediate FOV corresponding to the second k-space data; and reconstructing, using at least one of a compressed sensing algorithm or a parallel imaging algorithm, a magnetic resonance (MR) image of the subject based at least in part on the third k-space data.

In some embodiments, generating the third k-space data by calibrating the second k-space data may includes transforming the second k-space data into an image domain to determine the intermediate FOV; removing one or more edge portions from the original FOV in the image domain; designating the remaining portion of the original FOV as the central portion; and generating the third k-space data by transforming the central portion of the intermediate FOV into a k-space.

In some embodiments, the calibrated FOV may have a shape of a rectangle or a square.

In some embodiments, the operations further includes determining a weight for each calibrated data point of the third k-space data, wherein the MR image of the subject is reconstructed based at least in part on the third k-space data and the weight for each calibrated data point of the third k-space data.

In some embodiments, determining the weight for each calibrated data point of the third k-space data includes assigning a preliminary value for each first data point of the first k-space data; generating an intermediate value for each second data point of the second k-space data by regridding the preliminary value for each first data point of the first k-space data; designating the intermediate value for each second data point of the second k-space data as a value of a corresponding calibrated data point of the third k-space data; determining a modulus of the value of each calibrated data point; and designating the modulus as the weight of each calibrated data point of the third k-space data.

In some embodiments, the operations further includes determining a primary density calibration function of the first k-space data; determining, using an interpolation algorithm, a density calibration function of the third k-space data based on the primary density calibration function and coordinates of each calibrated data point of the third k-space data, wherein the MR image of the subject is reconstructed based at least in part on the third k-space data, the weight for each calibrated data point of the third k-space data, and the density calibration function.

In some embodiments, the operations further includes determining a coil sensitivity map based on the third k-space data, the weight of each calibrated data point of the third k-space data, and the density calibration function, wherein the MR image of the subject is reconstructed based at least in part on the third k-space data, the weight of each calibrated data point of the third k-space data, the density calibration function, and the coil sensitivity map.

In some embodiments, the first k-space data may be obtained in a radial sampling manner, and the first k-space data may include a first portion in a full-sampling region and a second portion in a partial-sampling region. The operations may further include updating the first k-space data by dividing the first portion by the weight.

In some embodiments, the non-Cartesian sampling manner may be a radial sampling manner or a spiral sampling manner.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein:

FIG. 9(a) illustrates an intermediate FOV corresponding to second k-space data according to some embodiments of the present disclosure;

FIG. 9(b) illustrates a calibrated FOV corresponding to third k-space data according to some embodiments of the present disclosure

DETAILED DESCRIPTION

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "engine," "unit," "module," and/or "block" used herein are one method to distinguish different components, elements, parts, sections or assembly of different levels in ascending order. However, the terms may be displaced by another expression if they achieve the same purpose.

Figure 3:
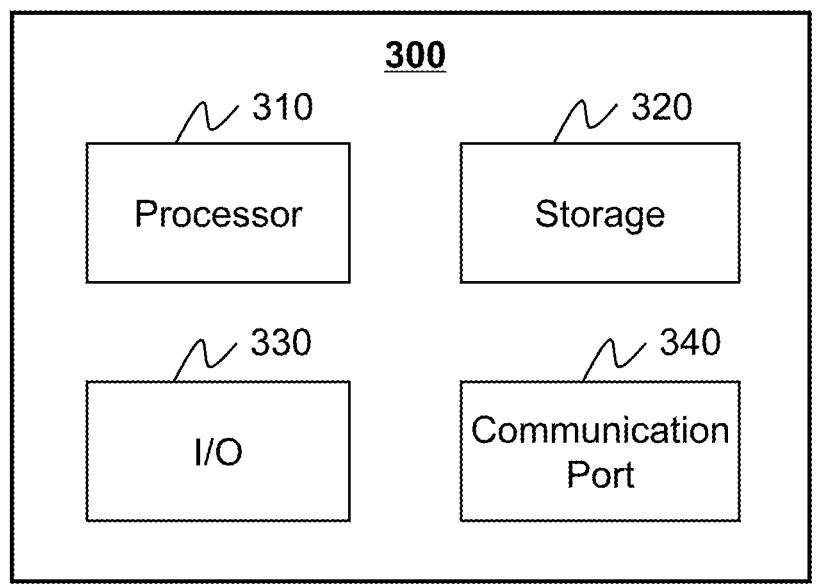
FIG. 3 is a schematic diagram illustrating exemplary hardware and/or software components of a computing device according to some embodiments of the present disclosure.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices (e.g., processor 310 as illustrated in FIG. 3) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device.

Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

It will be understood that when a unit, engine, module or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items. The term "image" in the present disclosure is used to collectively refer to image data (e.g., scan data, projection data) and/or images of various forms, including a two-dimensional (2D) image, a three-dimensional (3D) image, a four-dimensional (4D), etc. The term "pixel" and "voxel" in the present disclosure are used interchangeably to refer to an element of an image.

It will be understood that, although the terms "first," "second," "third," etc., may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

Provided herein are systems and methods for non-invasive biomedical imaging, such as for disease diagnostic or research purposes. While the systems and methods disclosed in the present disclosure are described primarily regarding SMS in an MRI system. It should be understood that this is only for illustration purposes. The systems and methods of the present disclosure may be applied to any other kind of imaging system. In some embodiments, the imaging system may include a single modality imaging system and/or a multi-modality imaging system. The single modality imaging system may include, for example, the MRI system. The multi-modality imaging system may include, for example, an X-ray imaging-magnetic resonance imaging (X-ray-MRI) system, a single photon emission computed tomography-magnetic resonance imaging (SPECT-MRI) system, a digital subtraction angiography-magnetic resonance imaging (DSA-MRI) system, a computed tomography-magnetic resonance imaging (MRI-CT) system, a positron emission tomography-magnetic resonance imaging (PET-MRI) system, etc.

An aspect of the present disclosure relates to systems and methods for MR imaging. The method may include obtaining first k-space data collected from a subject in a non-Cartesian sampling manner, generating second k-space data by regridding the first k-space data, and generating third k-space data by calibrating the second k-space data. A calibrated field of view (FOV) corresponding to the third k-space data is constituted by a central portion of an intermediate FOV corresponding to the second k-space data. The method may further include reconstructing, using at least one of a compressed sensing algorithm or a parallel imaging algorithm, a magnetic resonance (MR) image of the subject based at least in part on the third k-space data. By calibrating the second k-space data FOV, the amount of data used for image reconstruction may be reduced, thus improving the efficiency of the imaging process. In addition, the speed of the image reconstruction may be improved, and clinical needs for real-time imaging may also be satisfied.

Figure 1:
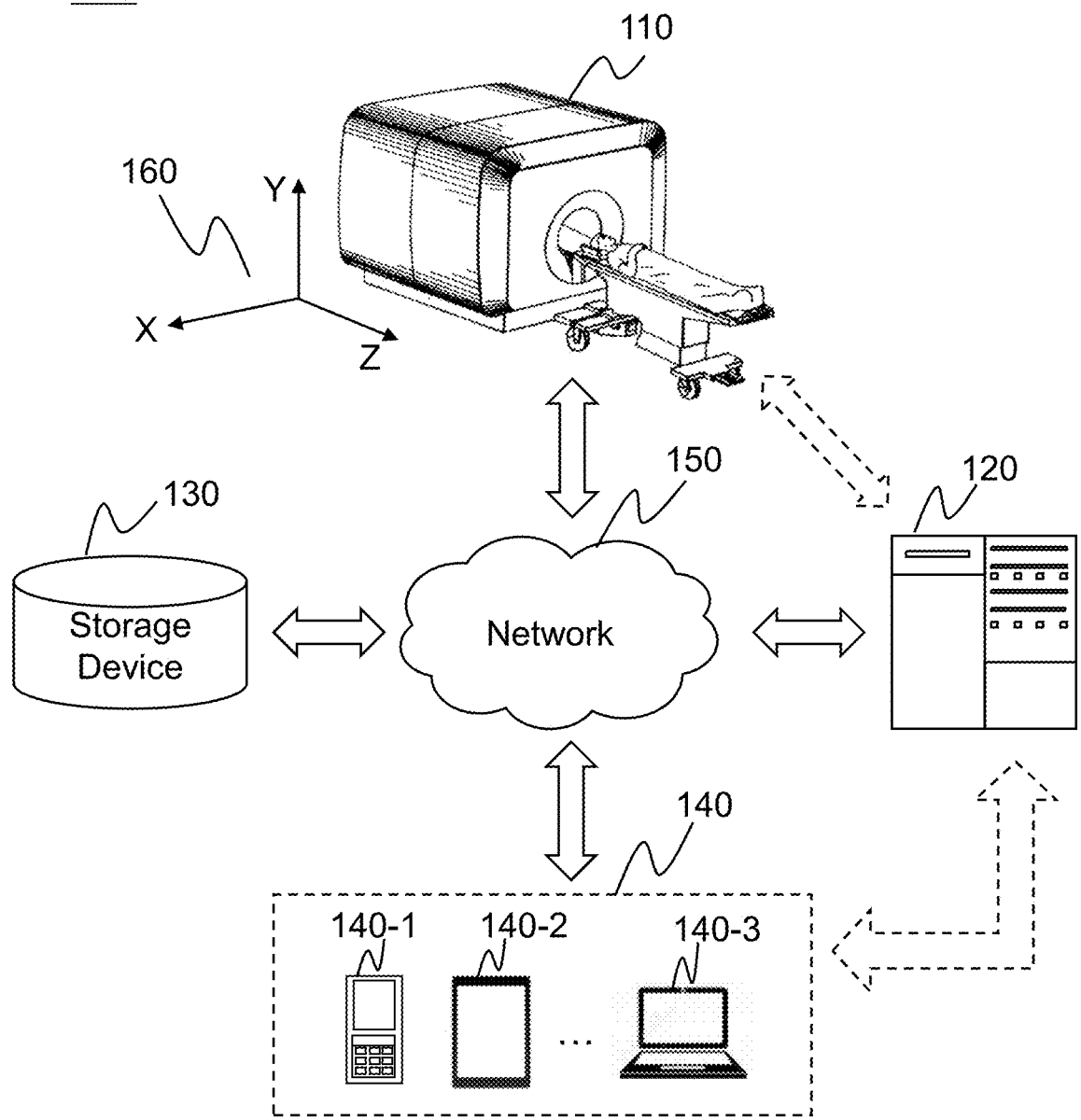
FIG. 1 is a schematic diagram illustrating an exemplary MRI system according to some embodiments of the present disclosure.

FIG. 1 is a schematic diagram illustrating an exemplary MRI system 100 according to some embodiments of the present disclosure. As shown in FIG. 1, the MRI system 100 may include an MR scanner 110 (or referred to as an MRI scanner), a processing device 120, a storage device 130, one or more terminals 140, and a network 150. In some embodiments, the MR scanner 110, the processing device 120, the storage device 130, and/or the terminal(s) 140 may be connected to and/or communicate with each other via a wireless connection, a wired connection, or a combination thereof. The connections between the components in the MRI system 100 may be variable. For example, the MR scanner 110 may be connected to the processing device 120 through the network 150. As another example, the MR scanner 110 may be connected to the processing device 120 directly.

The MR scanner 110 may be configured to scan a subject (or a part of the subject) to acquire image data, such as echo signals (or MR signals) associated with the subject. For example, the MR scanner 110 may detect a plurality of echo signals by applying an MR pulse sequence on the subject. In some embodiments, the MR scanner 110 may include, for example, a main magnet, a gradient coil (or also referred to a spatial encoding coil), a radio frequency (RF) coil, etc., as described in connection with FIG. 2. In some embodiments, the MR scanner 110 may be a permanent magnet MR scanner, a superconducting electromagnet MR scanner, or a resistive electromagnet MR scanner, etc., according to types of the main magnet. In some embodiments, the MR scanner 110 may be a high-field MR scanner, a mid-field MR scanner, and a low-field MR scanner, etc., according to the intensity of the magnetic field.

The subject scanned by the MR scanner 110 may be biological or non-biological. For example, the subject may include a patient, a man-made object, etc. As another example, the subject may include a specific portion, organ, tissue, and/or a physical point of the patient. Merely by way of example, the subject may include head, brain, neck, body, shoulder, arm, thorax, cardiac, stomach, blood vessel, soft tissue, knee, feet, or the like, or a combination thereof.

For illustration purposes, a coordinate system 160 including an X axis, a Y-axis, and a Z-axis is provided in FIG. 1. The X axis and the Z axis shown in FIG. 1 may be horizontal, and the Y-axis may be vertical. As illustrated, the positive X direction along the X axis may be from the right side to the left side of the MRI scanner 110 seen from the direction facing the front of the MRI scanner 110; the positive Y direction along the Y axis shown in FIG. 1 may be from the lower part to the upper part of the MRI scanner 110; the positive Z direction along the Z axis shown in FIG. 1 may refer to a direction in which the subject is moved out of the scanning channel (or referred to as the bore) of the MRI scanner 110.

In some embodiments, the MR scanner 110 may be directed to select an anatomical slice of the subject along a slice selection direction and scan the anatomical slice to acquire a plurality of echo signals from the slice. During the scan, spatial encoding within the slice may be implemented by spatial encoding coils (e.g., an X coil and a Y coil) along a phase encoding direction and a frequency encoding direction. The echo signals may be sampled and the corresponding sampled data may be stored into a K-space matrix for image reconstruction. For illustration purposes, the slice-selection direction herein may correspond to the Z direction defined by the coordinate system 160 and a Kz direction in K-space; the phase-encoding direction may correspond to the Y direction defined by the coordinate system 160 and a Ky direction in K-space; and the frequency-encoding direction may correspond to the X direction defined by the coordinate system 160 and a Kx direction in K-space. It should be noted that the slice-selection direction, the phase-encoding direction, and the frequency-encoding direction may be modified according to actual needs, and the modification may do not depart the scope of the present disclosure. More description of the MRI scanner 110 may be found elsewhere in the present disclosure. See, e.g., FIG. 2 and the description thereof.

The processing device 120 may process data and/or information obtained from the MR scanner 110, the storage device 130, and/or the terminal(s) 140. In some embodiments, the processing device 120 may be a single server or a server group. The server group may be centralized or distributed. In some embodiments, the processing device 120 may be local or remote. For example, the processing device 120 may access information and/or data from the MR scanner 110, the storage device 130, and/or the terminal(s) 140 via the network 150. As another example, the processing device 120 may be directly connected to the MR scanner 110, the terminal(s) 140, and/or the storage device 130 to access information and/or data. In some embodiments, the processing device 120 may be implemented on a cloud platform. For example, the cloud platform may include a private cloud, a public cloud, a hybrid cloud, a community cloud, a distributed cloud, an inter-cloud, a multi-cloud, or the like, or a combination thereof. In some embodiments, the processing device 120 may be implemented by a computing device 300 having one or more components as described in connection with FIG. 3.

The storage device 130 may store data, instructions, and/or any other information. In some embodiments, the storage device 130 may store data obtained from the MR scanner 110, the processing device 120, and/or the terminal(s) 140. In some embodiments, the storage device 130 may store data and/or instructions that the processing device 120 may execute or use to perform exemplary methods described in the present disclosure. In some embodiments, the storage device 130 may include a mass storage device, a removable storage device, a volatile read-and-write memory, a read-only memory (ROM), or the like, or a combination thereof. Exemplary mass storage devices may include a magnetic disk, an optical disk, a solid-state drive, etc. Exemplary removable storage devices may include a flash drive, a floppy disk, an optical disk, a memory card, a zip disk, a magnetic tape, etc. Exemplary volatile read-and-write memory may include a random access memory (RAM). Exemplary RAM may include a dynamic RAM (DRAM), a double date rate synchronous dynamic RAM (DDR SDRAM), a static RAM (SRAM), a thyristor RAM (T-RAM), a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), a digital versatile disk ROM, etc. In some embodiments, the storage device 130 may be implemented on a cloud platform as described elsewhere in the disclosure.

In some embodiments, the storage device 130 may be connected to the network 150 to communicate with one or more other components in the MRI system 100 (e.g., the MR scanner 110, the processing device 120, and/or the terminal(s) 140). One or more components of the MRI system 100 may access the data or instructions stored in the storage device 130 via the network 150. In some embodiments, the storage device 130 may be part of the processing device 120 or the terminal(s) 140.

The terminal(s) 140 may be configured to enable a user interaction between a user and the MRI system 100. For example, the terminal(s) 140 may receive an instruction to cause the MR scanner 110 to scan the subject from the user. As another example, the terminal(s) 140 may receive a processing result (e.g., an image of the subject) from the processing device 120 and display the processing result to the user. In some embodiments, the terminal(s) 140 may be connected to and/or communicate with the MR scanner 110, the processing device 120, and/or the storage device 130. In some embodiments, the terminal(s) 140 may include a mobile device 140-1, a tablet computer 140-2, a laptop computer 140-3, or the like, or a combination thereof. For example, the mobile device 140-1 may include a mobile phone, a personal digital assistant (PDA), a gaming device, a navigation device, a point of sale (POS) device, a laptop, a tablet computer, a desktop, or the like, or a combination thereof. In some embodiments, the terminal(s) 140 may include an input device, an output device, etc. The input device may include alphanumeric and other keys that may be input via a keyboard, a touch screen (for example, with haptics or tactile feedback), a speech input, an eye tracking input, a brain monitoring system, or any other comparable input mechanism. The input information received through the input device may be transmitted to the processing device 120 via, for example, a bus, for further processing. Other types of the input device may include a cursor control device, such as a mouse, a trackball, or cursor direction keys, etc. The output device may include a display, a speaker, a printer, or the like, or a combination thereof. In some embodiments, the terminal(s) 140 may be part of the processing device 120 or the MR scanner 110.

The network 150 may include any suitable network that can facilitate the exchange of information and/or data for the MRI system 100. In some embodiments, one or more components of the MRI system 100 (e.g., the MR scanner 110, the processing device 120, the storage device 130, the terminal(s) 140, etc.) may communicate information and/or data with one or more other components of the MRI system 100 via the network 150. For example, the processing device 120 may obtain image data (e.g., an echo signal) from the MR scanner 110 via the network 150. As another example, the processing device 120 may obtain user instructions from the terminal(s) 140 via the network 150. The network 150 may include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network ("VPN"), a satellite network, a telephone network, routers, hubs, switches, server computers, or the like, or a combination thereof. For example, the network 150 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or a combination thereof. In some embodiments, the network 150 may include one or more network access points. For example, the network 150 may include wired and/or wireless network access points such as base stations and/or internet exchange points through which one or more components of the MRI system 100 may be connected to the network 150 to exchange data and/or information.

This description is intended to be illustrative, and not to limit the scope of the present disclosure. Many alternatives, modifications, and variations will be apparent to those skilled in the art. The features, structures, methods, and characteristics of the exemplary embodiments described herein may be combined in various ways to obtain additional and/or alternative exemplary embodiments. In some embodiments, the MRI system 100 may include one or more additional components and/or one or more components described above may be omitted. Additionally or alternatively, two or more components of the MRI system 100 may be integrated into a single component. For example, the processing device 120 may be integrated into the MR scanner 110. As another example, a component of the MRI system 100 may be replaced by another component that can implement the functions of the component. In some embodiments, the storage device 130 may be a data storage including cloud computing platforms, such as a public cloud, a private cloud, a community and hybrid cloud, etc. However, those variations and modifications do not depart the scope of the present disclosure.

Figure 2:
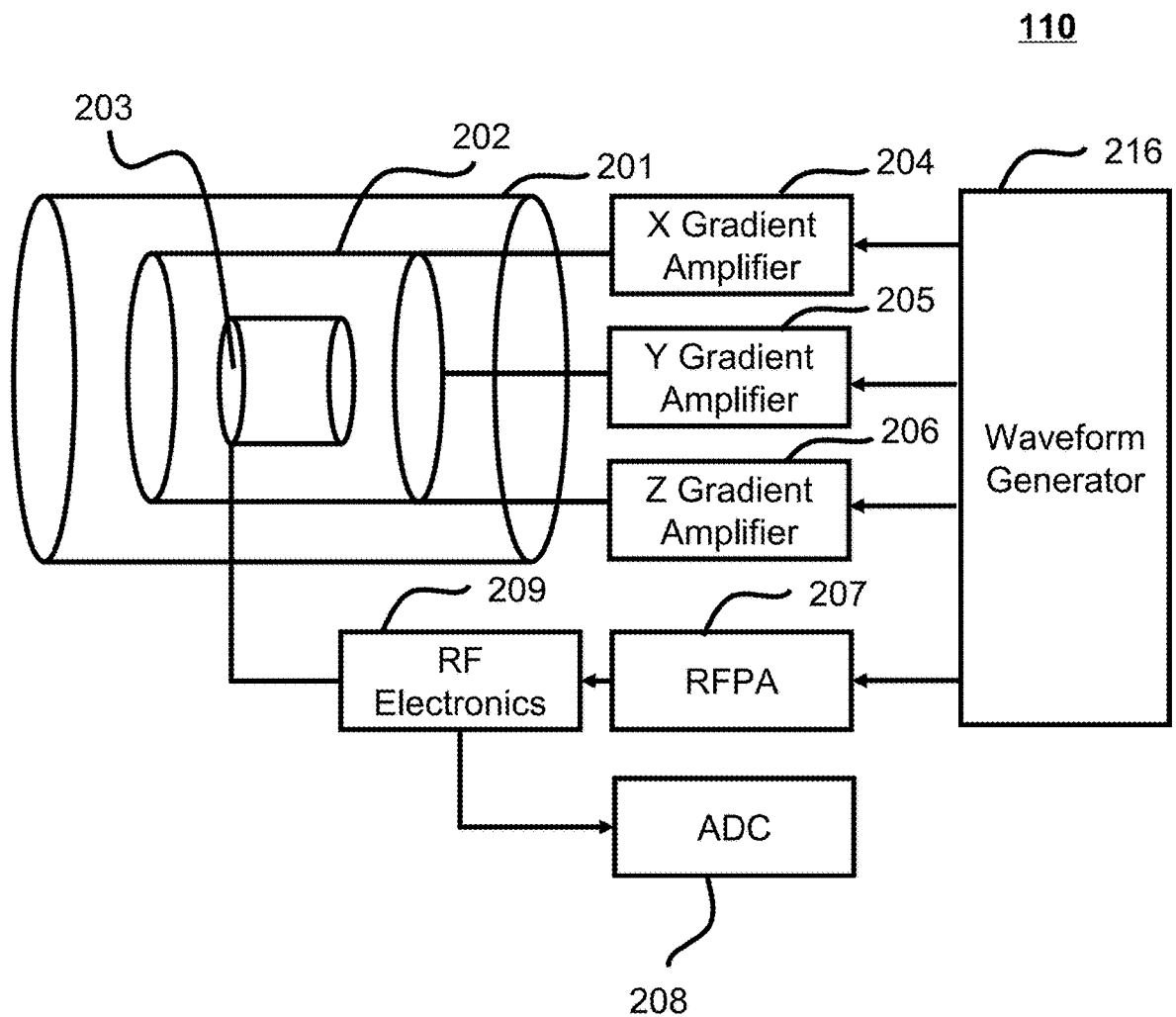
FIG. 2 is a schematic diagram illustrating an exemplary MR scanner according to some embodiments of the present disclosure.

FIG. 2 is a schematic diagram illustrating an exemplary MRI scanner 110 according to some embodiments of the present disclosure. One or more components of the MRI scanner 110 are illustrated in FIG. 2. As illustrated, main magnet 201 may generate a first magnetic field (or referred to as a main magnetic field) that may be applied to a subject (also referred to as an object) exposed inside the field. The main magnet 201 may include a resistive magnet or a superconductive magnet that both need a power supply (not shown) for operation. Alternatively, the main magnet 201 may include a permanent magnet. The main magnet 201 may include a bore that the subject is placed within. The main magnet 201 may also control the homogeneity of the generated main magnetic field. Some shim coils may be in the main magnet 201. The shim coils placed in the gap of the main magnet 201 may compensate for the inhomogeneity of the magnetic field of the main magnet 201. The shim coils may be energized by a shim power supply.

Gradient coils 202 may be located inside the main magnet 201. The gradient coils 202 may generate a second magnetic field (or referred to as a gradient field, including gradient fields Gx, Gy, and Gz). The second magnetic field may be superimposed on the main field generated by the main magnet 201 and distort the main field so that the magnetic orientations of the protons of a subject may vary as a function of their positions inside the gradient field, thereby encoding spatial information into echo signals generated by the region of the subject being imaged. The gradient coils 202 may include X coils (e.g., configured to generate the gradient field Gx corresponding to the X direction), Y coils (e.g., configured to generate the gradient field Gy corresponding to the Y direction), and/or Z coils (e.g., configured to generate the gradient field Gz corresponding to the Z direction) (not shown in FIG. 2). In some embodiments, the Z coils may be designed based on circular (Maxwell) coils, while the X coils and the Y coils may be designed on the basis of the saddle (Golay) coil configuration. The three sets of coils may generate three different magnetic fields that are used for position encoding. The gradient coils 202 may allow spatial encoding of echo signals for image construction. The gradient coils 202 may be connected with one or more of an X gradient amplifier 204, a Y gradient amplifier 205, or a Z gradient amplifier 206. One or more of the three amplifiers may be connected to a waveform generator 216. The waveform generator 216 may generate gradient waveforms that are applied to the X gradient amplifier 204, the Y gradient amplifier 205, and/or the Z gradient amplifier 206. An amplifier may amplify a waveform. An amplified waveform may be applied to one of the coils in the gradient coils 202 to generate a magnetic field in the X-axis, the Y-axis, or the Z-axis, respectively. The gradient coils 202 may be designed for either a close-bore MRI scanner or an open-bore MRI scanner. In some instances, all three sets of coils of the gradient coils 202 may be energized and three gradient fields may be generated thereby. In some embodiments of the present disclosure, the X coils and Y coils may be energized to generate the gradient fields in the X direction and the Y direction. As used herein, the X-axis, the Y-axis, the Z-axis, the X direction, the Y direction, and the Z direction in the description of FIG. 2 are the same as or similar to those described in FIG. 1.

In some embodiments, radio frequency (RF) coils 203 may be located inside the main magnet 201 and serve as transmitters, receivers, or both. The RF coils 203 may be in connection with RF electronics 209 that may be configured or used as one or more integrated circuits (ICs) functioning as a waveform transmitter and/or a waveform receiver. The RF electronics 209 may be connected to a radiofrequency power amplifier (RFPA) 207 and an analog-to-digital converter (ADC) 208.

When used as transmitters, the RF coils 203 may generate RF signals that provide a third magnetic field that is utilized to generate echo signals related to the region of the subject being imaged. The third magnetic field may be perpendicular to the main magnetic field. The waveform generator 216 may generate an RF pulse. The RF pulse may be amplified by the RFPA 207, processed by the RF electronics 209, and applied to the RF coils 203 to generate the RF signals in response to a powerful current generated by the RF electronics 209 based on the amplified RF pulse.

When used as receivers, the RF coils may be responsible for detecting echo signals. After excitation, the echo signals generated by the subject may be sensed by the RF coils 203. The receive amplifier then may receive the sensed echo signals from the RF coils 203, amplify the sensed echo signals, and provide the amplified echo signals to the ADC 208. The ADC 208 may transform the echo signals from analog signals to digital signals. The digital echo signals then may be sent to the processing device 120 for sampling.

In some embodiments, the gradient coils 202 and the RF coils 203 may be circumferentially positioned with respect to the subject. It is understood by those skilled in the art that the main magnet 201, the gradient coils 202, and the RF coils 203 may be situated in a variety of configurations around the subject.

In some embodiments, the RFPA 207 may amplify an RF pulse (e.g., the power of the RF pulse, the voltage of the RF pulse) such that an amplified RF pulse is generated to drive the RF coils 203. The RFPA 207 may include a transistor-based RFPA, a vacuum tube-based RFPA, or the like, or any combination thereof. The transistor-based RFPA may include one or more transistors. The vacuum tube-based RFPA may include a triode, a tetrode, a klystron, or the like, or any combination thereof. In some embodiments, the RFPA 207 may include a linear RFPA, or a nonlinear RFPA. In some embodiments, the RFPA 207 may include one or more RFPAs.

In some embodiments, the MRI scanner 110 may further include a subject positioning system (not shown). The subject positioning system may include a subject cradle and a transport device. The subject may be placed on the subject cradle and be positioned by the transport device within the bore of the main magnet 201.

MRI systems (e.g., the MRI system 100 disclosed in the present disclosure) may be commonly used to obtain an interior image from a patient for a particular region of interest (ROI) that can be used for the purposes of, e.g., diagnosis, treatment, or the like, or a combination thereof. MRI systems include a main magnet (e.g., the main magnet 201) assembly for providing a strong uniform main magnetic field to align the individual magnetic moments of the H atoms within the patient's body. During this process, the H atoms oscillate around their magnetic poles at their characteristic Larmor frequency. If the tissue is subjected to an additional magnetic field, which is tuned to the Larmor frequency, the H atoms absorb additional energy, which rotates the net aligned moment of the H atoms. The additional magnetic field may be provided by an RF excitation signal (e.g., the RF signal generated by the RF coils 203). When the additional magnetic field is removed, the magnetic moments of the H atoms rotate back into alignment with the main magnetic field thereby emitting an echo signal. The echo signal is received and processed to form an MR image. T1 relaxation may be the process by which the net magnetization grows/returns to its initial maximum value parallel to the main magnetic field. T1 may be the time constant for regrowth of longitudinal magnetization (e.g., along the main magnetic field). T2 relaxation may be the process by which the transverse components of magnetization decay or dephase. T2 may be the time constant for decay/dephasing of transverse magnetization.

If the main magnetic field is uniform across the entire body of the patient, then the RF excitation signal may excite all of the H atoms in the sample non-selectively. Accordingly, in order to image a particular portion of the patient's body, magnetic field gradients Gx, Gy, and Gz (e.g., generated by the gradient coils 202) in the x, y, and z directions, having a particular timing, frequency, and phase, may be superimposed on the uniform magnetic field such that the RF excitation signal excites the H atoms in a desired slice of the patient's body, and unique phase and frequency information is encoded in the echo signal depending on the location of the H atoms in the "image slice."

Typically, portions of the patient's body to be imaged are scanned by a sequence of measurement cycles in which the RF excitation signals and the magnetic field gradients Gx, Gy and Gz vary according to an MRI imaging protocol that is being used. A protocol may be designed for one or more tissues to be imaged, diseases, and/or clinical scenarios. A protocol may include a certain number of pulse sequences oriented in different planes and/or with different parameters. The pulse sequences may include spin echo sequences, gradient echo sequences, diffusion sequences, inversion recovery sequences, or the like, or any combination thereof. For instance, the spin echo sequences may include a fast spin echo (FSE) pulse sequence, a turbo spin echo (TSE) pulse sequence, a rapid acquisition with relaxation enhancement (RARE) pulse sequence, a half-Fourier acquisition single-shot turbo spin-echo (HASTE) pulse sequence, a turbo gradient spin echo (TGSE) pulse sequence, or the like, or any combination thereof. As another example, the gradient echo sequences may include a balanced steady-state free precession (bSSFP) pulse sequence, a spoiled gradient echo (GRE) pulse sequence, and an echo planar imaging (EPI) pulse sequence, a steady state free precession (SSFP), or the like, or any combination thereof. The protocol may also include information regarding image contrast and/or ratio, an ROI, slice thickness, an imaging type (e.g., T1 weighted imaging, T2 weighted imaging, proton density weighted imaging, etc.), T1, T2, an echo type (spin echo, fast spin echo (FSE), fast recovery FSE, single shot FSE, gradient recalled echo, fast imaging with stead-state procession, and so on), a flip angle value, acquisition time (TA), echo time (TE), repetition time (TR), echo train length (ETL), the number of phases, the number of excitations (NEX), inversion time, bandwidth (e.g., RF receiver bandwidth, RF transmitter bandwidth, etc.), or the like, or any combination thereof. For each MRI scan, the resulting echo signals may be digitized and processed to reconstruct an image in accordance with the MRI imaging protocol that is used.

FIG. 3 is a schematic diagram illustrating exemplary hardware and/or software components of a computing device 300 according to some embodiments of the present disclosure. The computing device 300 may be used to implement any component of the MRI system 100 as described herein. For example, the processing device 120 and/or the terminal 140 may be implemented on the computing device 300, respectively, via its hardware, software program, firmware, or a combination thereof. Although only one such computing device is shown, for convenience, the computer functions relating to the MRI system 100 as described herein may be implemented in a distributed fashion on a number of similar platforms, to distribute the processing load. As illustrated in FIG. 3, the computing device 300 may include a processor 310, a storage 320, an input/output (I/O) 330, and a communication port 340.

The processor 310 may execute computer instructions (e.g., program code) and perform functions of the processing device 120 in accordance with techniques described herein. The computer instructions may include, for example, routines, programs, objects, components, data structures, procedures, modules, and functions, which perform particular functions described herein. For example, the processor 310 may process image data obtained from the MR scanner 110, the terminal(s) 140, the storage device 130, and/or any other component of the MRI system 100. In some embodiments, the processor 310 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combinations thereof.

Merely for illustration, only one processor is described in the computing device 300. However, it should be noted that the computing device 300 in the present disclosure may also include multiple processors, thus operations and/or method operations that are performed by one processor as described in the present disclosure may also be jointly or separately performed by the multiple processors. For example, if in the present disclosure the processor of the computing device 300 executes both operation A and operation B, it should be understood that operation A and operation B may also be performed by two or more different processors jointly or separately in the computing device 300 (e.g., a first processor executes operation A and a second processor executes operation B, or the first and second processors jointly execute operations A and B).

The storage 320 may store data/information obtained from the MR scanner 110, the terminal(s) 140, the storage device 130, and/or any other component of the MRI system 100. In some embodiments, the storage 320 may include a mass storage device, a removable storage device, a volatile read-and-write memory, a read-only memory (ROM), or the like, or any combination thereof. In some embodiments, the storage 320 may store one or more programs and/or instructions to perform exemplary methods described in the present disclosure. For example, the storage 320 may store a program for the processing device 120 to execute for image reconstruction.

The I/O 330 may input and/or output signals, data, information, etc. In some embodiments, the I/O 330 may enable a user interaction with the processing device 120. In some embodiments, the I/O 330 may include an input device and an output device. The input device may include alphanumeric and other keys that may be input via a keyboard, a touch screen (for example, with haptics or tactile feedback), a speech input, an eye tracking input, a brain monitoring system, or any other comparable input mechanism. The input information received through the input device may be transmitted to another component (e.g., the processing device 120) via, for example, a bus, for further processing. Other types of the input device may include a cursor control device, such as a mouse, a trackball, or cursor direction keys, etc. The output device may include a display (e.g., a liquid crystal display (LCD), a light-emitting diode (LED)-based display, a flat panel display, a curved screen, a television device, a cathode ray tube (CRT), a touch screen), a speaker, a printer, or the like, or a combination thereof.

The communication port 340 may be connected to a network (e.g., the network 150) to facilitate data communications. The communication port 340 may establish connections between the processing device 120 and the MR scanner 110, the terminal(s) 140, and/or the storage device 130. The connection may be a wired connection, a wireless connection, any other communication connection that can enable data transmission and/or reception, and/or any combination of these connections. The wired connection may include, for example, an electrical cable, an optical cable, a telephone wire, or the like, or any combination thereof. The wireless connection may include, for example, a Bluetooth™ link, a Wi-Fi™ link, a WiMax™ link, a WLAN link, a ZigBee™ link, a mobile network link (e.g., 3G, 4G, 5G), or the like, or a combination thereof. In some embodiments, the communication port 340 may be and/or include a standardized communication port, such as RS232, RS485, etc. In some embodiments, the communication port 340 may be a specially designed communication port. For example, the communication port 340 may be designed in accordance with the digital imaging and communications in medicine (DICOM) protocol.

Figure 4:
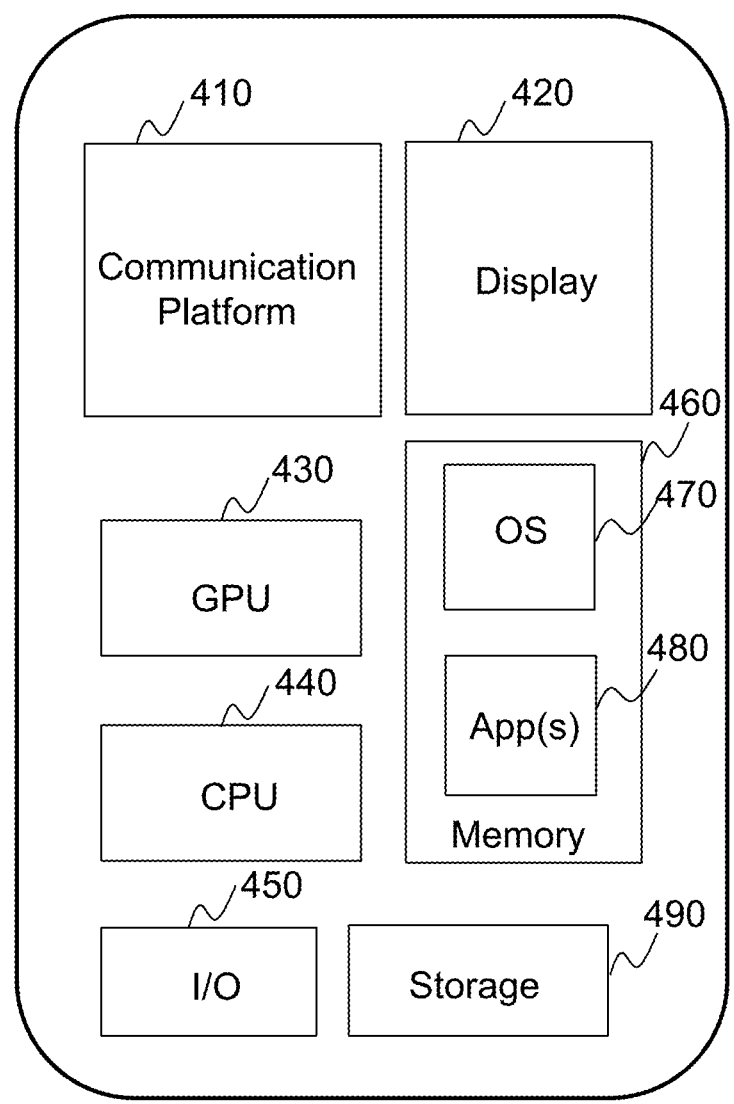
FIG. 4 is a schematic diagram illustrating exemplary hardware and/or software components of a mobile device according to some embodiments of the present disclosure.

FIG. 4 is a schematic diagram illustrating exemplary hardware and/or software components of a mobile device 400 according to some embodiments of the present disclosure. In some embodiments, one or more components (e.g., a terminal 140 and/or the processing device 120) of the MRI system 100 may be implemented on the mobile device 400.

As illustrated in FIG. 4, the mobile device 400 may include a communication platform 410, a display 420, a graphics processing unit (GPU) 430, a central processing unit (CPU) 440, an I/O 450, a memory 460, and a storage 490. In some embodiments, any other suitable component, including but not limited to a system bus or a controller (not shown), may also be included in the mobile device 400. In some embodiments, a mobile operating system 470 (e.g., iOS™, Android™, Windows Phone™) and one or more applications 480 may be loaded into the memory 460 from the storage 490 in order to be executed by the CPU 440. The applications 480 may include a browser or any other suitable mobile apps for receiving and rendering information relating to the MRI system 100. User interactions with the information stream may be achieved via the I/O 450 and provided to the processing device 120 and/or other components of the MRI system 100 via the network 150.

To implement various modules, units, and their functionalities described in the present disclosure, computer hardware platforms may be used as the hardware platform(s) for one or more of the elements described herein. A computer with user interface elements may be used to implement a personal computer (PC) or any other type of work station or terminal device. A computer may also act as a server if appropriately programmed.

Figure 5:
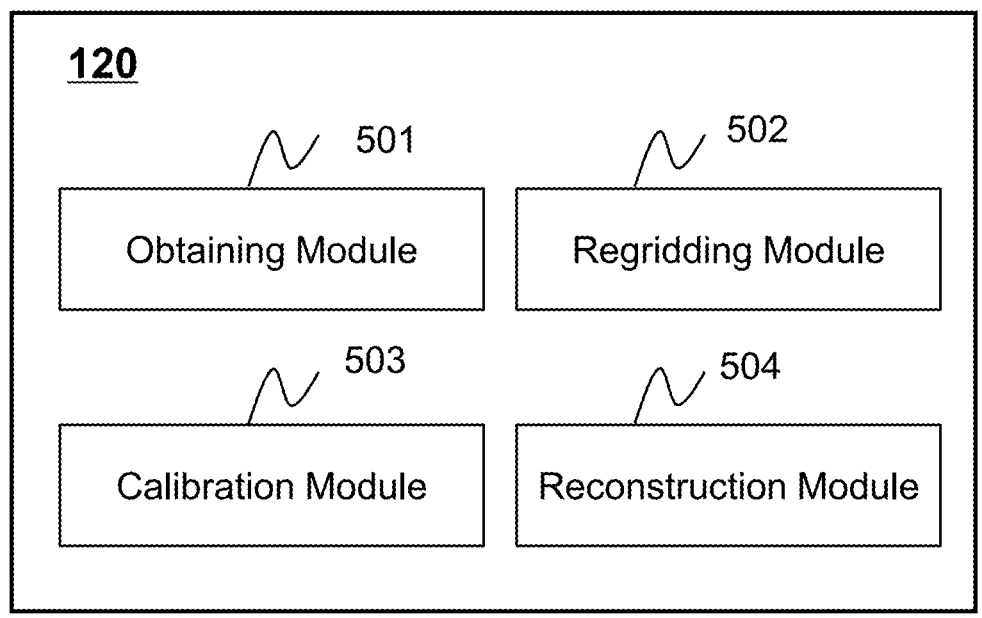
FIG. 5 is a block diagram illustrating an exemplary processing device according to some embodiments of the present disclosure.

FIG. 5 is a block diagram illustrating an exemplary processing device 120 according to some embodiments of the present disclosure. As shown in FIG. 5, the processing device 120 may include an obtaining module 510, a regridding module 520, a calibration module 530, and an image reconstruction module 504. One or more of the modules of the processing device 120 may be interconnected. The connection(s) may be wireless or wired. At least a portion of the processing device 120 may be implemented on a computing device 300 as illustrated in FIG. 3 or a mobile device as illustrated in FIG. 4.

The obtaining module 510 may data and/or information. The obtaining module 510 may obtain data and/or information from the MR scanner 110, one or more modules of the processing device 120, the storage device 130, the terminal(s) 140, or any devices or components capable of storing data via the network 150. For example, the obtaining module 510 may obtain data and/or information from a medical cloud data center (not shown) via the network 150. The obtained data and/or information may include MR data, k-space data, processed results, user instructions, algorithms, parameters (e.g., scanning parameters of the scanner 110), program codes, information of one or more subject, or the like, or a combination thereof. In some embodiments, obtaining module 510 may obtain first k-space data collected from a subject in a non-Cartesian sampling manner.

Generally, MR data may be sampled from a subject in a Cartesian sampling manner or a non-Cartesian sampling manner. MR data sampled in a Cartesian sampling manner may distribute on uniform grid points (also referred to as integer grid points) in a Cartesian coordinate system. As for non-Cartesian sampling, encoding gradients may be nonlinear and change with the time continuously. Sampling trajectories in a non-Cartesian sampling manner may no longer be straight lines in the Cartesian coordinate system. Thus, the time spent in the non-Cartesian sampling process may be reduced effectively. The non-Cartesian sampling manner may also have inherent characteristics of variable density sampling (i.e., a distribution density of data points of the MR data in different regions of a k-space may be different), such that the k-space may be filled more effectively.

The regridding module 520 may perform regridding operation on the first k-space data. Since data points of the first k-space data are not at the uniform grid points of the Cartesian coordinate system, image reconstruction based directly on the first k-space data may need a large amount of calculation and have a low imaging speed. As used herein, data points of the first k-space data may also be referred to as first data points. The first data points may need to be converted to the uniform grid points of the Cartesian coordinate system such that the imaging speed satisfies clinical requirements.

In some embodiments, the regridding module 520 may convert the first data points to the uniform grid points of the Cartesian coordinate system by performing a regridding operation. Exemplary regridding operations may include Jacobian regridding, Voronoi regridding, Jackson regridding, Pipe regridding, etc. In some embodiments, the regridding operation may relate to one or more regridding kernels. The first data points may be convolved with the one or more regridding kernels, and sampled onto evenly spaced grid points. Second k-space data may be generated after the regridding operation is performed on the first k-space data. Data points of the second k-space data may also be referred to as second data points.

The calibration module 530 may be generate third k-space data by calibrating the second k-space data. An FOV corresponding to the third k-space data may be smaller than an FOV corresponding to the second k-space data.

The FOV corresponding to the third k-space data may also be referred to as a calibrated FOV. The FOV corresponding to the second k-space data may also be referred to as an intermediate FOV. The FOV corresponding to the first k-space data may also be referred to as an original FOV. In some embodiments, the second k-space data may be calibrated such that the calibrated FOV is constituted by a part of the intermediate FOV. In some embodiments, the calibrated FOV may be constituted by a central portion of the intermediate FOV.

It is understood that an MR image reconstructed based on the first k-space data or the second k-space data may include a valid portion and one or more invalid portions. As used herein, the valid portion refers to a portion of the MR image reconstructed based on effective MR data. The valid portion may be located at a central portion of the MR image. Theoretically, no MR data is used to reconstruct the one or more invalid portions of the MR image. In practice, the one or more invalid portions of the MR image may be reconstructed based on ineffective data (e.g., data corresponding to stray MR signals). An invalid portion may be located at an edge portion of the MR image. For example, the MR image may have a shape of a square. The valid portion may be located at a central portion of the square. The one or more invalid portions may be located at edge portions (e.g., the upper side, the lower side, etc.) of the square.

In some embodiments, the calibration module 530 may perform a calibration operation in an image domain. To perform the calibration operation, the second k-space data may be transformed into the image domain (e.g., through an inverse Fourier transform (IFT)). The FOV corresponding to the second k-space data (i.e., the intermediate FOV) may be processed so as to obtain the calibrated FOV. For example, one or more edge portions of the intermediate FOV in the image domain may be identified. An edge portion may be a dark region corresponding to ineffective MR signals, which is located at an edge part of the intermediate FOV. At least one of the one or more edge portions may be removed from the intermediate FOV in the image domain. The remaining portion of the intermediate FOV may be designated as the central portion of the intermediate FOV. In some embodiments, the calibrated FOV may be constituted by the central portion of the intermediate FOV. The area of the calibrated FOV may be smaller than the area of the intermediate FOV. The third k-space data may be generated by transforming data corresponding to the central portion of the intermediate FOV (i.e., the calibrated FOV) in the image domain into the k-space (e.g., through a Fourier transform (FT)).

The image reconstruction module 540 may reconstruct an MR image of the subject. In some embodiments, the image reconstruction module 540 may reconstruct the MR image of the subject using a compressed sensing algorithm and/or a parallel imaging algorithm based at least in part on the third k-space data. After the third k-space data is generated, the third k-space data may be reconstructed using the parallel imaging algorithm and/or the compressed sensing algorithm to generate the MR image of the subject.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, the processing device 120 may include one or more additional modules, such as a storage module (not shown) for storing data. As another example, one or more modules of the processing device 120 described above may be omitted. Additionally or alternatively, two or more modules of the processing device 120 may be integrated into a single component. A module of the processing device 120 may be divided into two or more units.

Figure 6:
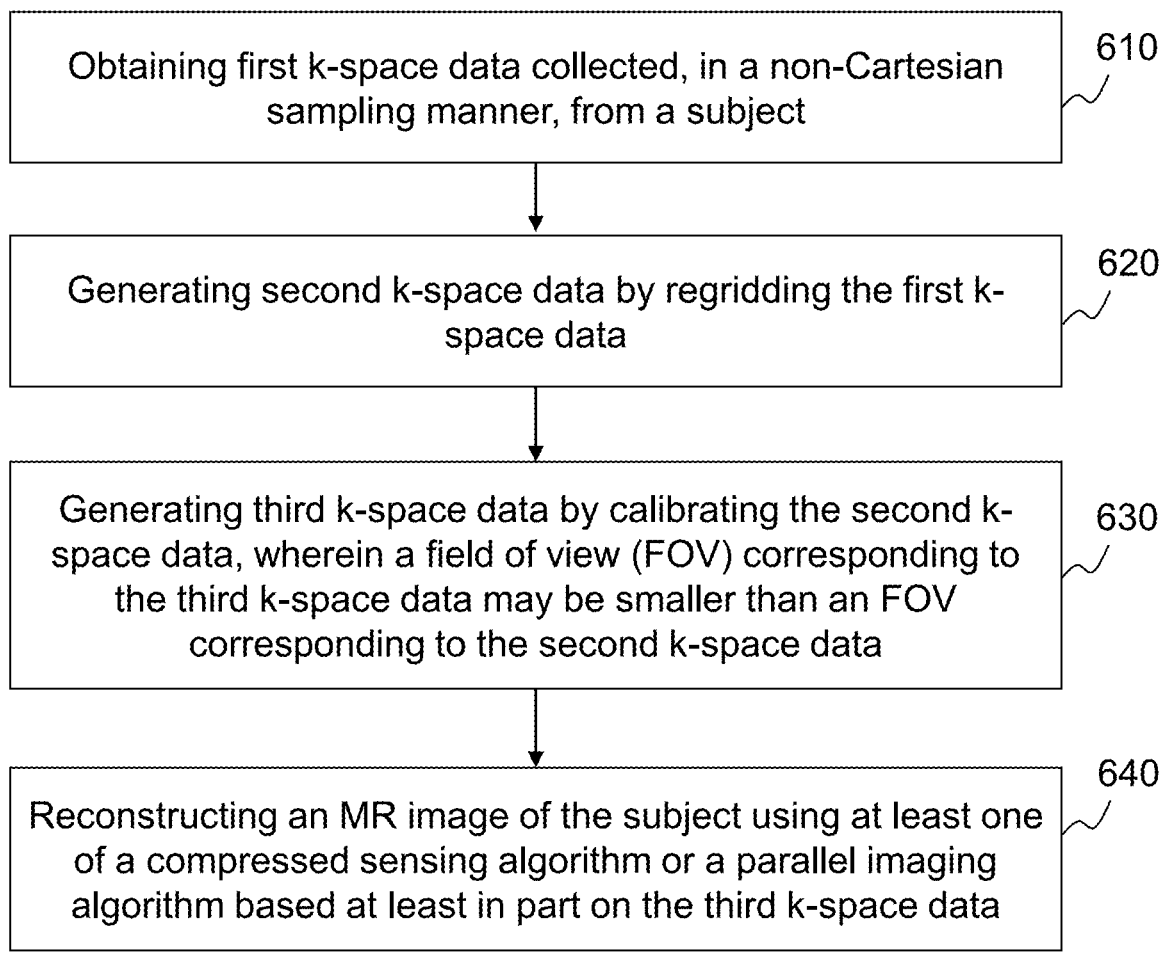
FIG. 6 is a flowchart illustrating an exemplary process for MR imaging according to some embodiments of the present disclosure.

FIG. 6 is a flowchart illustrating an exemplary process for MR imaging according to some embodiments of the present disclosure. In some embodiments, process 600 may be executed by the MRI system 100. For example, the process 600 may be implemented as a set of instructions (e.g., an application) stored in a storage device (e.g., the storage device 130, the storage 320, and/or the storage 490). In some embodiments, the processing device 120 (e.g., the processor 310 of the computing device 300, the CPU 440 of the mobile device 400, and/or one or more modules illustrated in FIG. 5) may execute the set of instructions and may accordingly be directed to perform the process 600.

Figure 7:
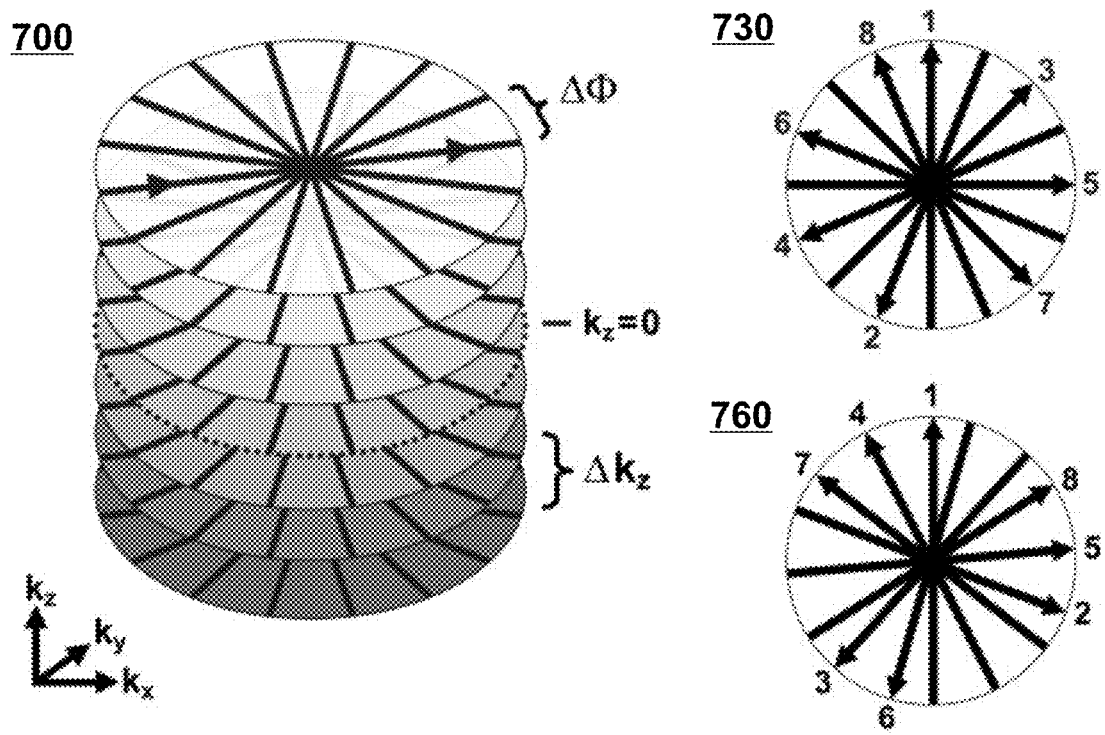
FIG. 7 is a schematic diagram illustrating an exemplary sampling manner of 3D stack of stars according to some embodiments of the present disclosure.

Merely for illustration purposes, technical solutions provided in the embodiments below may be applicable to dynamic contrast enhanced magnetic resonance imaging (DCE-MRI). As for the DCE-MRI, a contrast medium is introduced into a subject, and a plurality of MR images are sampled continuously over a time period after the contrast medium is distributed in organs or tissue of the subject. The plurality of images may indicate a variation of MR signals when the contrast medium traverses the organs or tissue. The variation of MR signals may be used to evaluate tissue perfusion and microvascular permeability. Three dimensional (3D) sampling (e.g., 3D stack of stars (SoS) illustrated in FIG. 7) and reconstruction technique are commonly used in DCE-MRI so as to obtain information related to tissue perfusion of a relatively large region. As shown in FIG. 7, a k-space for the 3D SoS constituted by axes $k_x$, $k_y$, and $k_z$ is provided in 700. In the k-space, multiple $k_x$-$k_y$ planes are stacked along the $k_z$ axis. A radial sampling manner may be used in each $k_x$-$k_y$ plane, and a Cartesian sampling manner may be used in the $k_z$ direction. In one or more $k_x$-$k_y$ planes, radial spokes (i.e., k-space data lines) under radial sampling may be uniformly distributed (e.g., as illustrated in 730). Alternatively, a golden angle sampling technique is used in one or more $k_x$-$k_y$ planes (e.g., as illustrated in 760). Illustratively, k-space data in one or more $k_x$-$k_y$ planes are processed and reconstructed by performing operations disclosed in the process 600.

In 610, first k-space data collected from a subject in a non-Cartesian sampling manner may be obtained. The first k-space data may be obtained by, for example, the obtaining module 510.

In some embodiments, the subject may include a body, a substance, or the like, or a combination thereof. In some embodiments, the subject may include a specific portion of a body, such as the head, the thorax, the abdomen, or the like, or a combination thereof. In some embodiments, the subject may include a specific organ, such as the heart, the esophagus, the trachea, the bronchus, the stomach, the gallbladder, the small intestine, the colon, the bladder, the ureter, the uterus, the fallopian tube, etc.

Generally, MR data may be sampled from a subject in a Cartesian sampling manner or a non-Cartesian sampling manner. MR data sampled in a Cartesian sampling manner may distribute on uniform grid points (also referred to as integer grid points) in a Cartesian coordinate system. However, phase encoding operations in a Cartesian sampling process may be time-consuming. The time spent in the Cartesian sampling process may increase significantly as the number of phase encoding operations increases.

As for non-Cartesian sampling, encoding gradients may be nonlinear and change with the time continuously. Sampling trajectories in a non-Cartesian sampling manner may no longer be straight lines in the Cartesian coordinate system. Thus, the time spent in the non-Cartesian sampling process may be reduced effectively. The non-Cartesian sampling manner may also have inherent characteristics of variable density sampling (i.e., a distribution density of data points of the MR data in different regions of a k-space may be different), such that the k-space may be filled more effectively.

Figure 8:
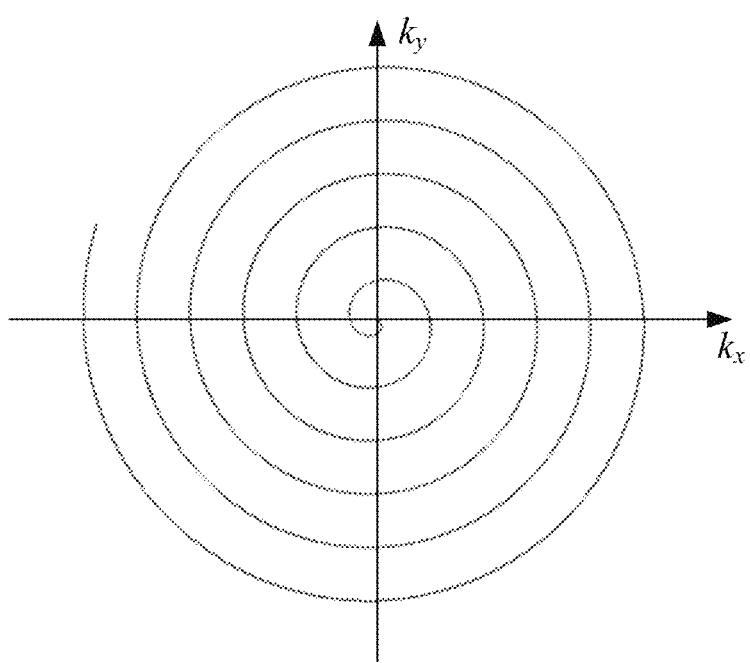
FIG. 8 illustrates an exemplary spiral sampling manner according to some embodiments of the present disclosure.

Exemplary non-Cartesian sampling manners may include a radial sampling manner (e.g., illustrated in FIG. 7), a spiral sampling manner (e.g., illustrated in FIG. 8), etc. As shown in FIG. 7, a radial sampling manner may be used in the $k_x$-$k_y$ plane, and a Cartesian sampling manner may be used in the $k_z$ direction. As for the radial sampling manner, a polar coordinate system is employed in the $k_x$-$k_y$ plane. Each radial spoke may pass through an origin of the polar coordinate system and point to different directions In some embodiments, the radial spokes under radial sampling may be uniformly distributed as illustrated in 730. Alternatively, a golden angle sampling technique may used as illustrated in 760. It should be noted that the descriptions below is provided in combination with the radial sampling manner, which is merely for illustration purposes, and not intended to limit the scope of the present disclosure. In some embodiments, the spiral sampling manner may be used to sample MR data from the subject.

The radial sampling manner may be insensitive to motion artifacts since data points at a center of the k-space is sampled multiple times during the non-Cartesian sampling process. Besides, as for the radial sampling manner, an image with better quality may be reconstructed based on under-sampled MR data in comparison with Cartesian sampling. In addition, the radial sampling manner may be suitable for the situation where a high imaging speed is needed, such as a functional MR imaging.

In 620, second k-space data may be generated by regridding the first k-space data. The second k-space data may be generated by, for example, the regridding module 520.

Since data points of the first k-space data are not at the uniform grid points of the Cartesian coordinate system, image reconstruction based directly on the first k-space data may need a large amount of calculation and have a low imaging speed. As used herein, data points of the first k-space data may also be referred to as first data points. The first data points may need to be converted to the uniform grid points of the Cartesian coordinate system such that the imaging speed satisfies clinical requirements.

In some embodiments, the first data points may be converted to the uniform grid points of the Cartesian coordinate system by performing a regridding operation. Exemplary regridding operations may include Jacobian regridding, Voronoi regridding, Jackson regridding, Pipe regridding, etc. In some embodiments, the regridding operation may relate to one or more regridding kernels. The first data points may be convolved with the one or more regridding kernels, and sampled onto evenly spaced grid points. Second k-space data may be generated after the regridding operation is performed on the first k-space data. Data points of the second k-space data may also be referred to as second data points.

In 630, third k-space data may be generated by calibrating the second k-space data. An FOV corresponding to the third k-space data may be smaller than an FOV corresponding to the second k-space data. The third k-space data may be generated by, for example, the calibration module 530.

The FOV corresponding to the third k-space data may also be referred to as a calibrated FOV. The FOV corresponding to the second k-space data may also be referred to as an intermediate FOV. The FOV corresponding to the first k-space data may also be referred to as an original FOV. In some embodiments, the second k-space data may be calibrated such that the calibrated FOV is constituted by a part of the intermediate FOV. In some embodiments, the calibrated FOV may be constituted by a central portion of the intermediate FOV.

Since data volume of the second k-space data may be relatively large, and image reconstruction based on the second k-space data may still need a large amount of computation. A calibration operation may be performed on the second k-space data so as to generate third k-space data of smaller data volume. The calibrated FOV corresponding to the third k-space data may be smaller than the intermediate FOV corresponding to the second k-space data.

It is understood that an MR image reconstructed based on the first k-space data or the second k-space data may include a valid portion and one or more invalid portions. As used herein, the valid portion refers to a portion of the MR image reconstructed based on effective MR data. The valid portion may be located at a central portion of the MR image. Theoretically, no MR data is used to reconstruct the one or more invalid portions of the MR image. In practice, the one or more invalid portions of the MR image may be reconstructed based on ineffective data (e.g., data corresponding to stray MR signals). An invalid portion may be located at an edge portion of the MR image. For example, the MR image may have a shape of a square. The valid portion may be located at a central portion of the square. The one or more invalid portions may be located at edge portions (e.g., the upper side, the lower side, etc.) of the square.

The regridding operation performed on the first k-space data in 620 may enlarge the original FOV. In this process, a valid portion located at a central portion of an original MR image reconstructed based on the first k-space data remains unchanged, and one or more invalid portions of the original MR image may be enlarged.

In some embodiments, the calibration operation may be performed in an image domain. To perform the calibration operation, the second k-space data may be transformed into the image domain (e.g., through an inverse Fourier transform (IFT)). The FOV corresponding to the second k-space data (i.e., the intermediate FOV) may be processed so as to obtain the calibrated FOV. For example, one or more edge portions of the intermediate FOV in the image domain may be identified. An edge portion may be a dark region corresponding to ineffective MR signals, which is located at an edge part of the intermediate FOV. At least one of the one or more edge portions may be removed from the intermediate FOV in the image domain. The remaining portion of the intermediate FOV may be designated as the central portion of the intermediate FOV. In some embodiments, the calibrated FOV may be constituted by the central portion of the intermediate FOV. The area of the calibrated FOV may be smaller than the area of the intermediate FOV. The third k-space data may be generated by transforming data corresponding to the central portion of the intermediate FOV (i.e., the calibrated FOV) in the image domain into the k-space (e.g., through a Fourier transform (FT)).

In some embodiments, the intermediate FOV may be processed by clipping the intermediate FOV into a desired shape. In some embodiments, the intermediate FOV may be processed by removing at least one of the one or more invalid portions of the intermediate FOV. The calibrated FOV may have a shape of a square, a rectangle, a circle, an ellipse, a polygon, etc. For example, the intermediate FOV having a shape of a square may be clipped into a rectangle. Illustratively, FIG. 9(a) illustrates an intermediate FOV corresponding to second k-space data according to some embodiments of the present disclosure. The intermediate FOV 900 may have a shape of a square. The intermediate FOV 900 may include two edge portions (an upper portion 910 and a lower portion 920 of the square) corresponding to ineffective MR signals. The intermediate FOV 900 may be processed by removing at least one of the two edge portions (e.g, both the two edge portions). The remaining portion of the intermediate FOV 900 may be designated as a central portion 930 of the intermediate FOV 900. FIG. 9(b) illustrates a calibrated FOV corresponding to third k-space data according to some embodiments of the present disclosure. The calibrated FOV 950 may be constituted by the central portion 930 of the intermediate FOV 900. The calibrated FOV 950 may have a shape of a rectangle. As another example, the intermediate FOV having a shape of a square may be clipped to a square. Despite of various shapes of the calibrated FOV, the calibrated FOV may include the entire valid portion.

It should be noted that the way to process the intermediate FOV is not limited to clipping, any other feasible methods that facilitate the reduction of the area of the intermediate FOV as well as the data volume of the second K-space data may be employed. By processing the intermediate FOV, the amount of data used for image reconstruction may be reduced, thus improving the efficiency of the imaging process.

In 640, an MR image of the subject may be reconstructed, using at least one of a compressed sensing algorithm or a parallel imaging algorithm, based at least in part on the third k-space data. In some embodiments, the MR image of the subject may be reconstructed by the reconstruction module 540. After the third k-space data is generated, the third k-space data may be reconstructed using the parallel imaging algorithm and/or the compressed sensing algorithm to generate the MR image of the subject.

Technical solutions of the MR imaging method provided in the process 600 may include obtaining the first k-space data collected in a non-Cartesian sampling manner from the subject, generating the second k-space data by regridding the first k-space data such that each data point of the second k-space data may be located at a uniform grid point of the Cartesian coordinate system, generating the third k-space data by calibrating the second k-space data such that the calibrated FOV corresponding to the third k-space data may be smaller than the intermediate FOV corresponding to the second k-space data, and reconstructing the MR image of the subject based on the third k-space data using the parallel imaging algorithm and/or the compressed sensing algorithm. A smaller data volume of the third k-space data (relative to the first k-space data or the second k-space data) may facilitate the employment of the parallel imaging algorithm and/or compressed sensing algorithm in the image reconstruction. In this case, the speed of the image reconstruction may be improved significantly, and clinical needs for real-time imaging may also be satisfied.

Figure 10:
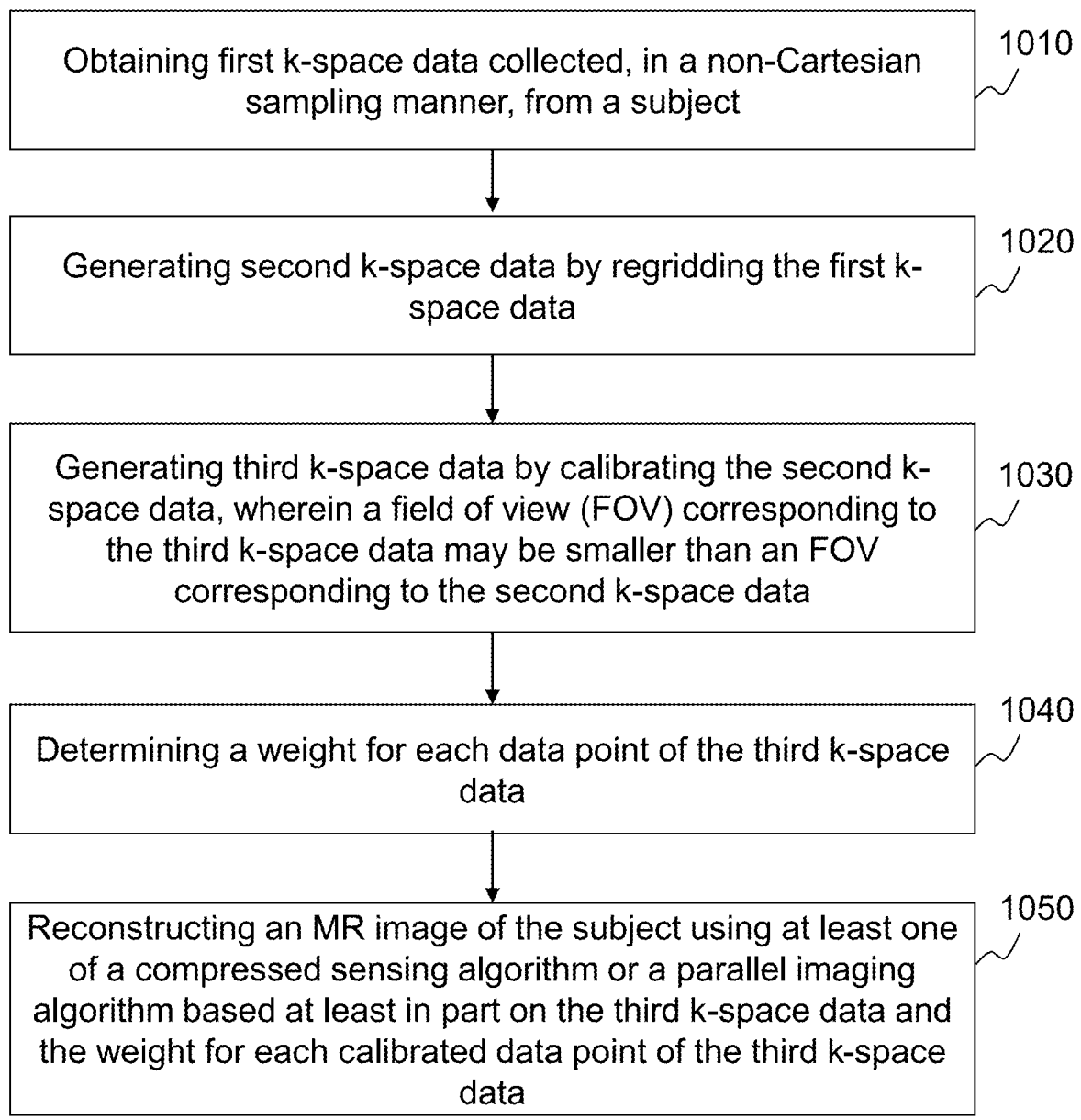
FIG. 10 is a flowchart illustrating an exemplary process for MR imaging according to some embodiments of the present disclosure.

FIG. 10 is a flowchart illustrating an exemplary process for MR imaging according to some embodiments of the present disclosure. In some embodiments, process 1000 may be executed by the MRI system 100. For example, the process 1000 may be implemented as a set of instructions (e.g., an application) stored in a storage device (e.g., the storage device 130, the storage 320, and/or the storage 490). In some embodiments, the processing device 120 (e.g., the processor 310 of the computing device 300, the CPU 440 of the mobile device 400, and/or one or more modules illustrated in FIG. 5) may execute the set of instructions and may accordingly be directed to perform the process 1000. In some embodiments, the process 1000 may be similar to or the same as the process 600 except that the process 1000 further includes operations for determining a weight of each data point of the third k-space data.

In 1010, first k-space data collected from a subject in a non-Cartesian sampling manner may be obtained.

In 1020, second k-space data may be generated by regridding the first k-space data.

In 1030, third k-space data may be generated by calibrating the second k-space data. An FOV corresponding to the third k-space data may be smaller than an FOV corresponding to the second k-space data.

In 1040, a weight for each data point of the third k-space data may be determined. Data points of the third k-space data may also be referred to calibrated data points or third data points. The weight for each calibrated data point may be determined by, for example, the calibration module 530.

In order to improve the accuracy of the image reconstruction, the third k-space data may further be calibrated according to the weight for each calibrated data point before the MR image is reconstructed.

In some embodiments, a preliminary value may be assigned to each first data point of the first k-space data. The preliminary value may also be referred to as a preliminary weight. An intermediate value for each second data point of the second k-space data may be generated by regridding the preliminary value for each first data point of the first k-space data. The intermediate value for each second data point of the second k-space data may be designated as a value of a corresponding calibrated data point of the third k-space data In this process, a calibrated FOV may be determined by processing the FOV corresponding to the intermediate values. A modulus of the value of each calibrated data point may be determined. The modulus of each weight corresponding to the calibrated FOV may be designated as the weight for each calibrated data point. Detailed descriptions regarding the determination of the weight may be disclosed elsewhere in the present disclosure, for example, FIG. 11 and the descriptions thereof.

In 1050, an MR image of the subject may be reconstructed, using at least one of a compressed sensing algorithm or a parallel imaging algorithm, based at least in part on the third k-space data and the weight for each calibrated data point of the third k-space data.

Figure 11:
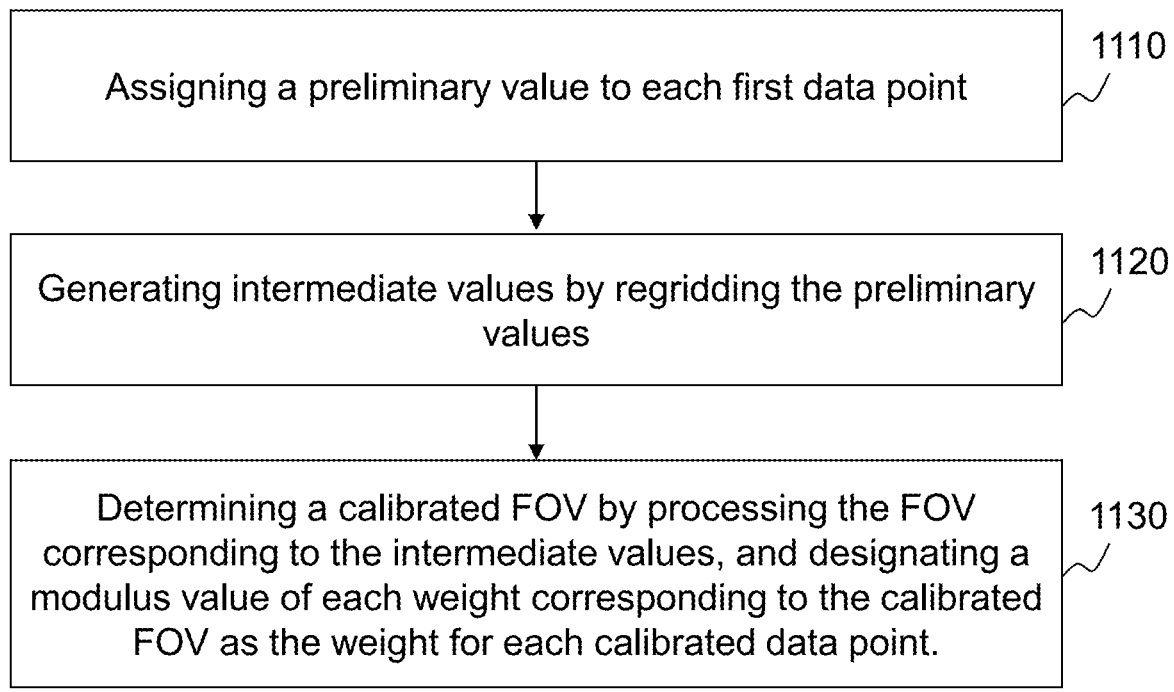
FIG. 11 is a flowchart illustrating an exemplary process for determining a weight for each calibrated data point of the third k-space data according to some embodiments of the present disclosure.

FIG. 11 is a flowchart illustrating an exemplary process for determining a weight for each calibrated data point of the third k-space data according to some embodiments of the present disclosure. In some embodiments, process 1100 may be executed by the MRI system 100. For example, the process 1100 may be implemented as a set of instructions (e.g., an application) stored in a storage device (e.g., the storage device 130, the storage 320, and/or the storage 490). In some embodiments, the processing device 120 (e.g., the processor 310 of the computing device 300, the CPU 440 of the mobile device 400, and/or one or more modules illustrated in FIG. 5) may execute the set of instructions and may accordingly be directed to perform the process 1100. In some embodiments, the process 1100 may be described in combination with the operations in the process 600.

In 1110, a preliminary value may be assigned to each first data point. The preliminary value may also be referred to as a preliminary weight. The preliminary value may be defined by a user (e.g., a doctor, a technician, etc.), according to default settings of the MRI system 100, etc. In some embodiments, the preliminary value may be set according to actual needs. In some embodiments, the preliminary value may be integers such as 1, 2, 3, 4, 5, 6, 8, 10, etc. In some embodiments, a same preliminary value may be assigned to each first data point. For example, all the preliminary values assigned to the first data points may be 1. In some embodiments, different preliminary values may be assigned to different first data points.

In 1120, intermediate values may be generated by regridding the preliminary values. Each intermediate value may correspond to a second data point. In some embodiments, an intermediate value for each second data point may be generated by regridding the preliminary value assigned for each first data point.

Since the weights are used to calibrate the third data points (also referred to calibrated data points) of the third k-space data, each weight may correspond to a third data point. Correspondingly, each intermediate value may correspond to a second data point.

In some embodiments, the preliminary values may be converted to the uniform grid points of the Cartesian coordinate system by performing a regridding operation. Exemplary regridding operations may include Jacobian regridding, Voronoi regridding, Jackson regridding, Pipe regridding, etc. In some embodiments, the regridding operation may relate to one or more regridding kernels. The preliminary values may be convolved with the one or more regridding kernels, and sampled onto evenly spaced grid points. The intermediate values may be generated after the regridding operation is performed on the preliminary values. In some embodiments, the regridding operation performed on the preliminary values may be similar to or the same as the regridding operation in 620 of the process 600 as illustrated in FIG. 6.

In 1130, a calibrated FOV may be determined by processing the FOV corresponding to the intermediate values, and a modulus value of each weight corresponding to the calibrated FOV may be designated as the weight for each calibrated data point.

In some embodiments, the calibrated FOV may be determined by clipping the FOV corresponding to the intermediate values (also referred to as intermediate FOV). Merely by ways of example, the calibrated FOV may have a shape of a rectangle. The intermediate FOV corresponding to the intermediate values may also be clipped into other shapes, such as a square, a circle, etc. The calibrated FOV corresponding to the weights may have a same shape and size as the calibrated FOV corresponding to the third k-space data. In some embodiments, the weight corresponding to each third data point of the third k-space data may be determined after the third k-space data is determined.

In some embodiments, the third k-space data and the weight corresponding to each third data point of the third k-space data may be determined simultaneously. The calibrated FOV may correspond to the third k-space data, and each third data point of the third k-space data may correspond to a weight. The intermediate FOV may correspond to the second k-space data, and each second data point of the second k-space data may correspond to an intermediate value. The calibrated FOV may be obtained by clipping at least one of the one or more edge portions of the intermediate FOV. The calibrated FOV may be clipped to a square, a rectangle, a circle, an ellipse, a polygon, etc. Merely by way of example, the calibrated FOV may have a shape of a rectangle. In some embodiments, the intermediate value for each second data point of the second k-space data may be designated as a weight of a corresponding calibrated data point of the third k-space data.

Since the intermediate values are complex numbers, modulus of the value of each calibrated data point may be calculated, and the modulus may be designated as the weight of each calibrated data point of the third k-space data.

According to the embodiments provided in the present disclosure, the data volume of the third k-space data for reconstructing the MR image may be reduced by changing the FOV of the MR image. In this case, the MR data sampled in a non-Cartesian sampling manner may be used for image reconstruction according to the parallel imaging algorithm and/or the compressed sensing algorithm. In addition, the third k-space data may be calibrated by the weight for each third data point of the third k-space data, which may improve the quality of the reconstructed MR image.

Figure 12:
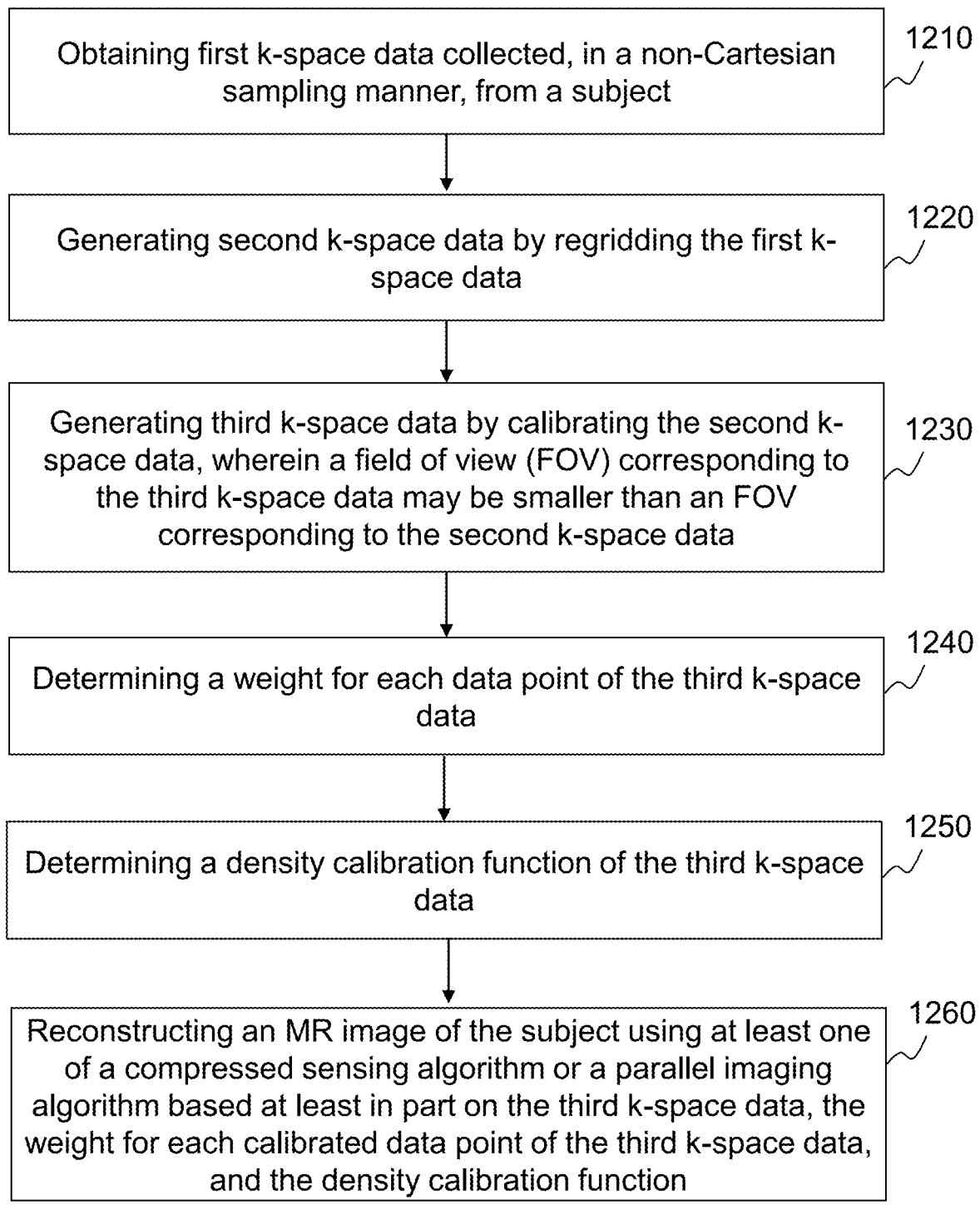
FIG. 12 is a flowchart illustrating an exemplary process for MR imaging according to some embodiments of the present disclosure.

FIG. 12 is a flowchart illustrating an exemplary process for MR imaging according to some embodiments of the present disclosure. In some embodiments, process 1200 may be executed by the MRI system 100. For example, the process 1200 may be implemented as a set of instructions (e.g., an application) stored in a storage device (e.g., the storage device 130, the storage 320, and/or the storage 490). In some embodiments, the processing device 120 (e.g., the processor 310 of the computing device 300, the CPU 440 of the mobile device 400, and/or one or more modules illustrated in FIG. 5) may execute the set of instructions and may accordingly be directed to perform the process 1200. In some embodiments, the process 1200 may be similar to or the same as the process 1000 except that the process 1200 further includes operations for determining a density calibration function.

In 1210, first k-space data collected from a subject in a non-Cartesian sampling manner may be obtained.

In 1220, second k-space data may be generated by regridding the first k-space data.

In 1230, third k-space data may be generated by calibrating the second k-space data. An FOV corresponding to the third k-space data may be smaller than an FOV corresponding to the second k-space data.

In 1240, a weight for each data point of the third k-space data may be determined.

In 1250, a density calibration function of the third k-space data may be determined. The density calibration function of the third k-space data may be determined by, for example, the calibration module 530. In the image reconstruction process, a density correction operation (also referred to sampling density compensation) may be performed on MR data so as to improve the quality of an MR image. In some embodiments, the density correction operation may be implemented by a density calibration function.

In some embodiments, the calibration module 530 may determine a primary density calibration function of the first k-space data. The primary density calibration function may correspond to the first k-space data. Coordinates of each first data point of the first k-space data may be determined in the k-space. In some embodiments, the primary density calibration function may be estimated based on coordinates of each first data point of the first k-space data. It should be noted that any feasible methods or algorithms may be used to determine the primary density calibration function.

The density calibration function may correspond to the third k-space data. Coordinates of each third data point of the third k-space data may be determined in the k-space. In some embodiments, the density calibration function may be determined based on the primary density calibration function, coordinates of each first data point of the first k-space data, and coordinates of each calibrated data point of the third k-space data. In some embodiments, the calibration module 530 determine the density calibration function using an interpolation algorithm. For example, the calibration module 530 may determine the density calibration function by preforming an interpolation operation on the primary density calibration function according to the coordinates of each first data point of the first k-space data and the coordinates of each calibrated data point of the third k-space data. The interpolation algorithm is provided herein for illustration purposes, any methods or algorithms that facilitate the determination of the density calibration function may be employed.

In some embodiments, the first k-space data may include a first portion and a second portion. The first portion may include data points in a full-sampling region. The second portion may include data points in a partial-sampling region. The first k-space in which the first k-space data is filled may include a central portion and one or more edge portions. The central portion refers to an area substantially at the center of the first k-space. The one or more edge portions refers to one or more areas surrounding the central portion of the first k-space. The full-sampling region may be located at the central portion of the first k-space. The partial-sampling region may be located at at least one edge portion of the first k-space.

In some embodiments, the first k-space data may be updated, such that the weights corresponding to the third k-space data and density calibration function of the full-sampling region may be 1. In this case, the computation in at least a part of the embodiments above may be simplified. In some embodiments, the first k-space data may be updated based on the weights of the third k-space data. Merely by way of example, each data point in the full-sampling region may be divided by a weight of a corresponding third data point.

In 1260, an MR image of the subject may be reconstructed, using at least one of a compressed sensing algorithm or a parallel imaging algorithm, based at least in part on the third k-space data, the weight for each calibrated data point of the third k-space data, and the density calibration function.

In some embodiments, one or more coil sensitivity maps (CSM) may further be determined after the third k-space data, the weights corresponding to the third k-space data, and density calibration function are determined. In some embodiments, the MRI system 100 may include multiple receiver coils. Each coil image may be weighted differently by a coil sensitivity map. The coil sensitivity map may be determined so as to exploit the spatially varying sensitivities of the multiple receiver coils, and accelerate the image acquisition process. In some embodiments, the one or more coil sensitivity maps may be determined based on the third k-space data, the weight of each calibrated data point of the third k-space data, and the density calibration function. It should be noted that any feasible methods or algorithms may be used to determine the one or more coil sensitivity maps. The MR image of the subject may be reconstructed based on the third k-space data, the weight of each calibrated data point of the third k-space data, the density calibration function, and the one or more coil sensitivity maps.

In some embodiments, the reconstruction of the MR image may associate with a objective function. For example, the objective function may be expressed as Equation (1):

$$d = \arg\min_d \frac{1}{2} \|w_2(w_1 FCd - S_c)\|^2 + \lambda \|Td\|^1, \quad (1)$$

where $w_1$ denotes the weight of each calibrated data point of the third k-space data, $w_2$ denotes the density calibration function, F denotes a Fourier transform, C denotes the coil sensitivity map, d denotes the reconstructed MR image (e.g., a static image, one or more dynamic images, etc.), $S_c$ denotes the third k-space data, and T denotes a sparse transform.

In some embodiments, the MR image may be reconstructed using the compressed sensing algorithm and/or the parallel imaging algorithm by performing a plurality of iterations. The objective function may be optimized in the plurality of iterations. In some embodiments, the plurality of iterations may terminate when a maximum number of iterations is performed. The maximum number may be set by an operator, according to default settings of the MRI system 100, etc. In some embodiments, the plurality of iterations may terminate when an acceptable MR image is obtained.

It should be noted that the process 1200 for MR imaging is merely provided for the purposes of illustration, and not intended to limit the scope of the present disclosure. For persons having ordinary skills in the art, multiple variations and modifications may be made under the teachings of the present disclosure. For example, the operation 1240 may be performed after the operation 1250 is complete. As another example, the operations 1240 and 1250 may be performed simultaneously. However, those variations and modifications do not depart from the scope of the present disclosure.

Figure 13:
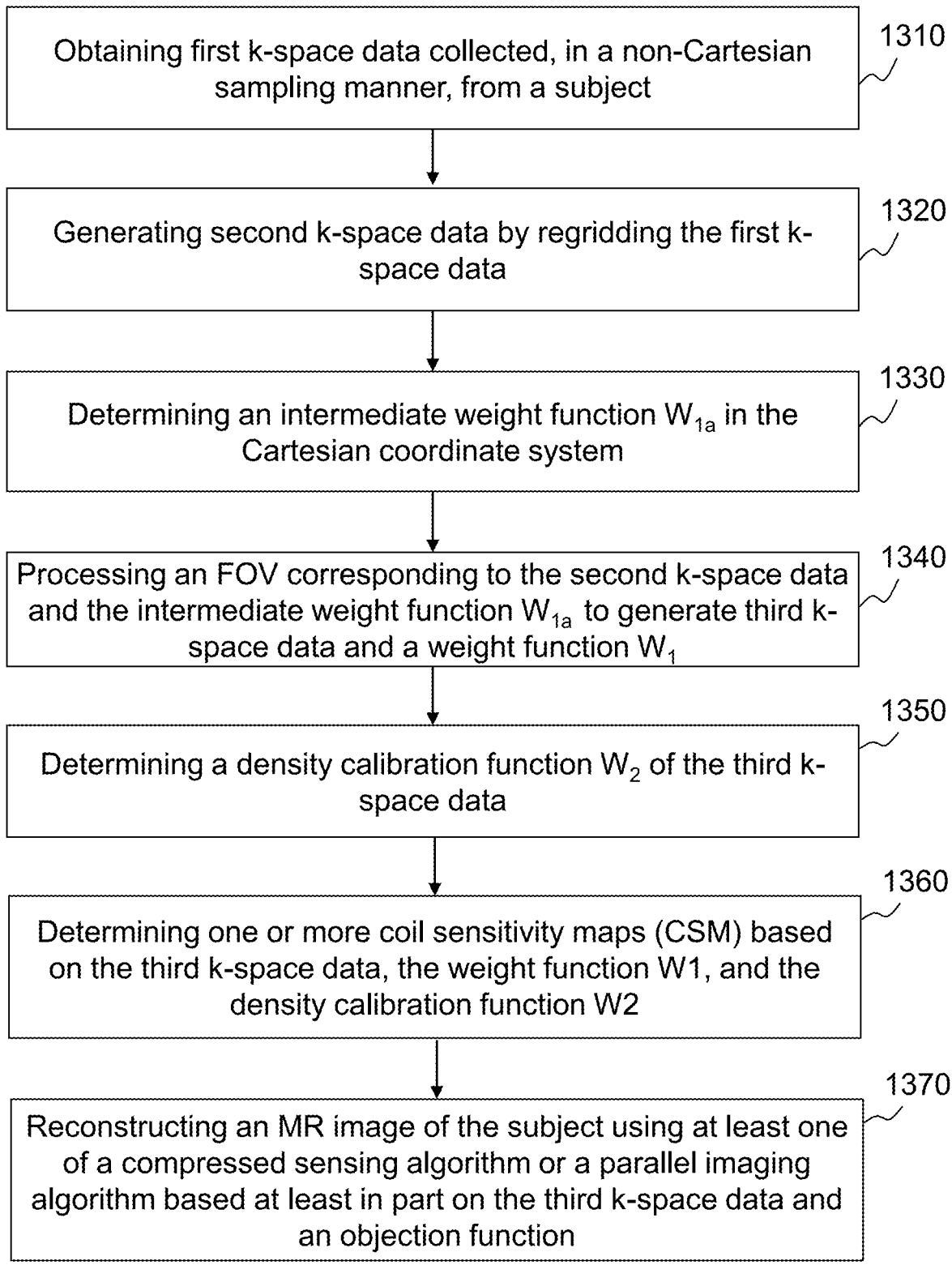
FIG. 13 is a flowchart illustrating an exemplary process for MR imaging according to some embodiments of the present disclosure.

FIG. 13 is a flowchart illustrating an exemplary process for MR imaging according to some embodiments of the present disclosure. In some embodiments, process 1300 may be executed by the MRI system 100. For example, the process 1300 may be implemented as a set of instructions (e.g., an application) stored in a storage device (e.g., the storage device 130, the storage 320, and/or the storage 490). In some embodiments, the processing device 120 (e.g., the processor 310 of the computing device 300, the CPU 440 of the mobile device 400, and/or one or more modules illustrated in FIG. 5) may execute the set of instructions and may accordingly be directed to perform the process 1300.

In 1310, first k-space data collected from a subject in a non-Cartesian sampling manner may be obtained. In some embodiments, the operation 1310 may be similar to or the same as the operation 610 of the process 600 in FIG. 6.

In 1320, second k-space data may be generated by regridding the first k-space data into a Cartesian coordinate system. In some embodiments, the operation 1320 may be similar to or the same as the operation 620 of the process 600 in FIG. 6.

In 1330, an intermediate weight function $W_{1a}$ in the Cartesian coordinate system may be determined. In some embodiments, the weight for each coordinate in the Cartesian coordinate system may be determined based on coordinates of the first data points of the first k-space data. Merely for illustration purposes, a preliminary value may be assigned to each first data point. In some embodiments, the preliminary value may be integers such as 1, 2, 3, 4, 5, 6, 8, 10, etc. For example, the preliminary value may be 1. The intermediate weight function $W_{1a}$ may be determined by regridding the preliminary values. The intermediate weight function $W_{1a}$ may include a plurality of values corresponding to each coordinate in the Cartesian coordinate system.

In 1340, an FOV corresponding to the second k-space data and the intermediate weight function $W_{1a}$ may be processed. In some embodiments, the processing operation may be performed in an image domain. During this process, the second k-space data and the intermediate weight function $W_{1a}$ may be transformed into the image domain (e.g., through an inverse Fourier transform (IFT)). The FOV corresponding to the second k-space data and the intermediate weight function $W_{1a}$ (an intermediate FOV) may be processed (e.g., at least one invalid portion may be removed) so as to obtain the calibrated FOV. The area of the calibrated FOV may be smaller than the area of the intermediate FOV. Then data corresponding to the calibrated FOV in the image domain may be transformed into the k-space (e.g., through a Fourier transform (FT)) so as to generate third k-space data and a weight function $W_1$ (a modulus value) corresponding to the third k-space data. In order to improve the accuracy of image reconstruction, the third k-space data may be calibrated according to the weight function $W_1$ before an MR image is reconstructed. The weight function $W_1$ may include a plurality of weights, each of which corresponds to a third data point.

In 1350, a density calibration function $W_2$ of the third k-space data may be determined. In some embodiments, the calibration module 530 may determine a primary density calibration function $W_{2a}$. The primary density calibration function $W_{2a}$ may correspond to the first k-space data. Coordinates of each first data point of the first k-space data may be determined in the k-space. In some embodiments, the primary density calibration function $W_{2a}$ may be estimated based on coordinates of each first data point of the first k-space data.

The density calibration function $W_2$ may correspond to the third k-space data. Coordinates of each third data point of the third k-space data may be determined in the k-space. In some embodiments, the density calibration function $W_2$ may be determined based on the primary density calibration function $W_{2a}$, coordinates of each first data point of the first k-space data, and coordinates of each calibrated data point of the third k-space data. In some embodiments, the calibration module 530 determine the density calibration function $W_2$ using an interpolation algorithm. For example, the calibration module 530 may determine the density calibration function $W_2$ by preforming an interpolation operation on the primary density calibration function $W_{2a}$ according to the coordinates of each first data point of the first k-space data and the coordinates of each calibrated data point of the third k-space data.

In 1360, one or more coil sensitivity maps (CSM) may be determined based on the third k-space data, the weight function $W_1$, and the density calibration function $W_2$.

In 1370, an MR image of the subject may be reconstructed, using at least one of a compressed sensing algorithm or a parallel imaging algorithm, based at least in part on the third k-space data and an objection function (e.g., the object function in Equation (1)).

In some embodiments, the MR image may be reconstructed using the compressed sensing algorithm and/or the parallel imaging algorithm by performing a plurality of iterations. The objective function may be optimized in the plurality of iterations. In some embodiments, the plurality of iterations may terminate when a maximum number of iterations is performed. The maximum number may be set by an operator, according to default settings of the MRI system 100, etc. In some embodiments, the plurality of iterations may terminate when an acceptable MR image is obtained.

Figure 14:
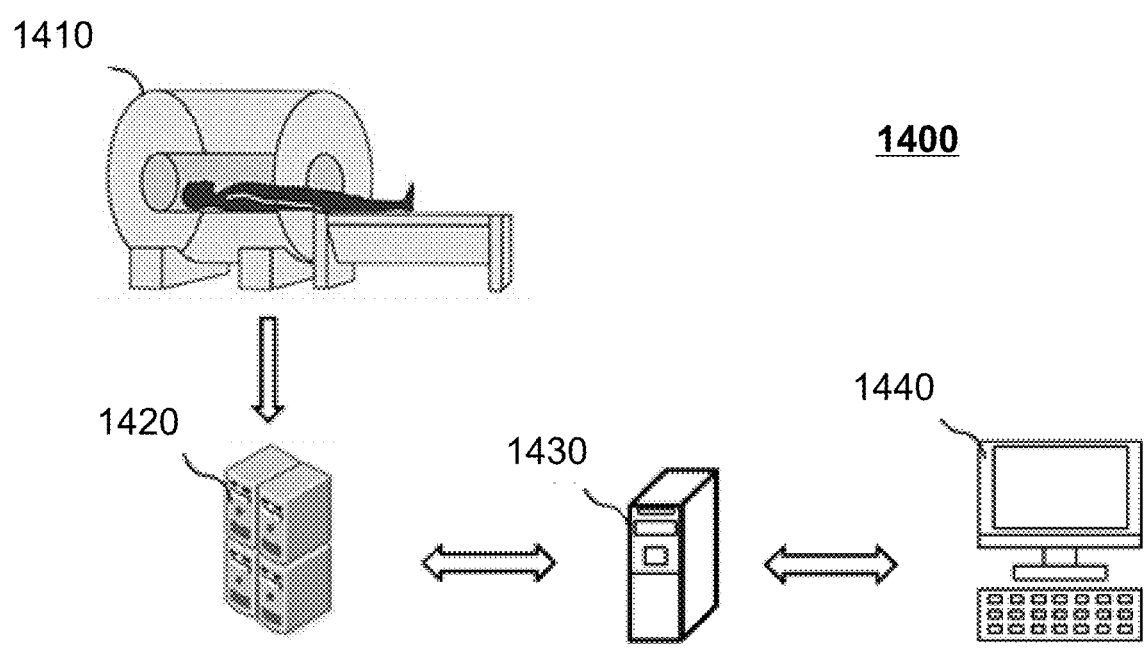
FIG. 14 is a structural diagram of an MRI system 1400 according to some embodiments of the present disclosure.

FIG. 14 is a structural diagram of an MRI system 1400 according to some embodiments of the present disclosure. The MRI system 1400 may include an MR scanner 1410 and a processor 1420. The MR scanner 1410 may obtain first k-space data collected from a subject in a non-Cartesian sampling manner. The processor 1420 may generate second k-space data by regridding the first k-space data, and generate third k-space data by calibrating the second k-space data. A field of view (FOV) corresponding to the third k-space data may be smaller than an FOV corresponding to the second k-space data. The processor 1420 may further reconstruct, using a compressed sensing algorithm and/or a parallel imaging algorithm, an MR image of the subject based at least in part on the third k-space data. In some embodiments, the processor 1420 may process the FOV corresponding to the second k-space data (i.e., the intermediate FOV) to generate a rectangular FOV corresponding to the third k-space data (i.e., the calibrated FOV), and determine the k-space data corresponding to the rectangular FOV as the third k-space data.

The processor 1420 may perform a regridding operation and a calibration operation on the k-space data in a non-Cartesian coordinate system, and third k-space data may be generated. The MR image may be reconstructed using the parallel imaging algorithm and/or the compressed sensing algorithm based on the third k-space data, thus improving the speed of image reconstruction significantly and satisfying clinical needs for real-time imaging. Besides, the reduction of the data volume of the k-space data used for image reconstruction may enable the use the parallel imaging algorithm and/or the compressed sensing algorithm in the image reconstruction.

As shown in FIG. 14, the MRI system 1400 further may include a controller 1430 and an output device 1440. The controller 1430 may monitor or control the MR scanner 1410, the processor 1420, and/or the output device 1440. In some embodiments, the controller 1430 may include a central processing unit (CPU), an application-specific integrated circuit (ASIC), an application-specific instruction-set processor (ASIP), a graphics processing unit (GPU), a physics processing unit (PPU), a digital signal processor (DSP), a field programmable gate array (FPGA), an ARM processor, or the like, or any combination thereof.

The output device 1440 may output MR images of a region of interest (ROI). Further, the output device 1440 may output parameters such as the height, the weight, the age, and/or a scanned body part of the subject, the operating state of the MR scanner 1410, or the like. In some embodiments, the output device 1440 may be a display device, such as a cathode ray tube (CRT) display, a liquid crystal display (LCD), an organic light emitting display (OLED), a plasma display, etc.

The MRI system 1400 may connect to a network for facilitating data transmission. The network may include a local area network (LAN), a wide area network (WAN), a public network, a private network, a proprietary network, a public switched telephone network (PSTN), an Internet, a wireless network, a virtual network, or the like, or any combination thereof.

The MR scanner 1410 may include an MR signal acquisition module, a control module, and a data storage module. The MR signal acquisition module may include a magnet unit and a radio frequency (RF) unit. The magnet unit may include a main magnet that generates a main magnetic field $B_0$ and gradient components that generate a gradient magnetic field. The main magnet may be a permanent magnet or a superconducting magnet, and the gradient components may include gradient current amplifiers and gradient coils. The gradient components may also include three independent channels $G_x$, $G_y$, $G_z$. Each gradient amplifier may excite one of the gradient coils, and generate a gradient field for producing spatial encoding signals so as to locate a magnetic resonance signal in a 2D or 3D space. The RF unit may include an RF transmitting coil and an RF receiving coil. The RF transmitting coil may transmit an RF pulse signal to a subject (e.g., a human body). The RF receiving coil may receive magnetic resonance signals from the human body. The RF coils of the RF unit may include body coils and local coils. In some embodiments, the body coils or local coils may be in various types, such as a birdcage coil, a solenoid coil, a saddle coil, a Helmholtz coil, an array coil, a loop coil, or the like. In some embodiments, the local coils may be arranged as an array coil, and the array coil may be set to a 4-channel mode, an 8-channel mode, or a 16-channel mode. The magnet unit and the RF unit may constitute an open low field magnetic resonance device or an enclosed superconducting magnetic resonance device.

The control module may monitor the MR signal acquisition module including the magnet unit, the RF unit, and a processing module. In some embodiments, the control module may receive information or pulse parameters sent by the MR signal acquisition module. In addition, the control module may also control data processing of the processing module. In some embodiments, the control module may further connect to a pulse sequence generator, a gradient waveform generator, a transmitter, a receiver, etc., and execute corresponding scan sequences after an instruction is received from a controller.

Merely for illustration purposes, the MR scanner 1410 may generate MR data (i.e., MR imaging data) in a scanning process in which one or more of the following operations are performed. The main magnet may generate a main magnetic field $B_0$, and nuclei in the body of the subject may have a precession frequency under the main magnetic field, and the precession frequency may be proportional to a magnetic field intensity of the main magnetic field. The control module may store and transmit instructions encoding a scan sequence to be executed. The pulse sequence generator may control the gradient waveform generator and the transmitter according to the instructions. The gradient waveform generator may output a gradient pulse signal having a predetermined time sequence and waveform. The gradient pulse signal may pass through the gradient current amplifiers, and the three independent channels $G_x$, $G_y$, and $G_z$ in the gradient components. Each gradient amplifier may excite one of the gradient coils, and generate a gradient field for producing spatial encoding signals so as to locate a magnetic resonance signal in a 2D or 3D space. The pulse sequence generator may execute scan sequences, and output data including a transmitting time, an intensity, a shape, etc. of each RF pulse, a receiving time of each RF signal, and a length of a data acquisition window to the transmitter. At the same time, the transmitter may transmit a corresponding RF pulse to one or more body coils in the RF unit to generate a field Bi. Signals from nuclei in the body of the subject excited by the field Bi may be received by receiving coils in the RF unit, transmitted to the processing module through transmitting/receiving switches, digitized using amplification, demodulation, filtration, AD conversion, etc., and transmitted to the data storage module. After the storage module acquires a set of original k-space data, the scanning process may terminate. The set of original k-space data may be rearranged into a plurality of k-space data sets, each of which may correspond to an image to be reconstructed. Each k-space data set may be input into an array processor for image reconstruction, and a set of image data may be generated.

In some embodiments, a storage medium storing computer executable instructions, wherein when executed by a processor, an MR imaging method may be executed. The method may include obtaining first k-space data collected from a subject in a non-Cartesian sampling manner, generating second k-space data by regridding the first k-space data, generating third k-space data by calibrating the second k-space data. A field of view (FOV) corresponding to the third k-space data may be smaller than an FOV corresponding to the second k-space data. The method may further include reconstructing, using at least one of a compressed sensing algorithm or a parallel imaging algorithm, an MR image of the subject based at least in part on the third k-space data.

In some embodiments, the computer executable instructions stored in the storage medium are not limited. Instructions related to other operations for MR imaging may also be provided.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB. NET, Python or the like, conventional procedural programming languages, such as the "C" programming language, Visual Basic, Fortran 2103, Perl, COBOL 2102, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, for example, an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed object matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±1%, ±5%, ±10%, or ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting effect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A magnetic resonance (MR) imaging system, comprising:
at least one non-transitory computer-readable storage device including a set of instructions; and
at least one processor configured to communicate with the at least one storage device, wherein when executing the set of instructions, the at least one processor is configured to direct the system to perform operations including:
obtaining first k-space data collected by a magnetic resonance (MR) scanner from a subject in a non-Cartesian sampling manner, wherein the non-Cartesian sampling is a variable density sampling;
generating second k-space data by regridding the first k-space data;
generating third k-space data by calibrating the second k-space data, wherein a calibrated field of view (FOV) corresponding to the third k-space data is constituted by a central portion of an intermediate FOV corresponding to the second k-space data; and
reconstructing, using at least one of a compressed sensing algorithm or a parallel imaging algorithm, a magnetic resonance (MR) image of the subject based at least in part on the third k-space data.

2. A method implemented on a computing device having a processor and a non-transitory computer-readable storage device, the method comprising:
obtaining first k-space data collected from a subject in a non-Cartesian sampling manner, wherein the non-Cartesian sampling is a variable density sampling;
generating second k-space data by regridding the first k-space data;
generating third k-space data by calibrating the second k-space data, wherein a calibrated field of view (FOV) corresponding to the third k-space data is constituted by a central portion of an intermediate FOV corresponding to the second k-space data; and
reconstructing, using at least one of a compressed sensing algorithm or a parallel imaging algorithm, a magnetic resonance (MR) image of the subject based at least in part on the third k-space data.

3. A non-transitory computer-readable storage medium including instructions, that, when accessed by at least one processor of a system, causes the system to perform a method, the method comprising:
obtaining first k-space data collected from a subject in a non-Cartesian sampling manner, wherein the non-Cartesian sampling is a variable density sampling;
generating second k-space data by regridding the first k-space data;
generating third k-space data by calibrating the second k-space data, wherein a calibrated field of view (FOV) corresponding to the third k-space data is constituted by a central portion of an intermediate FOV corresponding to the second k-space data; and
reconstructing, using at least one of a compressed sensing algorithm or a parallel imaging algorithm, a magnetic resonance (MR) image of the subject based at least in part on the third k-space data.

4. The system of claim 1, wherein generating the third k-space data by calibrating the second k-space data includes:
transforming the second k-space data into an image domain to determine the intermediate FOV;
removing one or more edge portions from the original FOV in the image domain;
designating the remaining portion of the original FOV as the central portion; and
generating the third k-space data by transforming the central portion of the intermediate FOV into a k-space.

5. The system of claim 1, wherein the calibrated FOV has a shape of a rectangle or a square.

6. The system of claim 1, wherein the operations further includes:
determining a weight for each calibrated data point of the third k-space data, wherein the MR image of the subject is reconstructed based at least in part on the third k-space data and the weight for each calibrated data point of the third k-space data.

7. The system of claim 6, wherein determining the weight for each calibrated data point of the third k-space data includes:
assigning a preliminary value for each first data point of the first k-space data;
generating an intermediate value for each second data point of the second k-space data by regridding the preliminary value for each first data point of the first k-space data;
designating the intermediate value for each second data point of the second k-space data as a value of a corresponding calibrated data point of the third k-space data;
determining a modulus of the value of each calibrated data point; and
designating the modulus as the weight of each calibrated data point of the third k-space data.

8. The system of claim 6, wherein the operations further includes:
determining a primary density calibration function of the first k-space data;
determining, using an interpolation algorithm, a density calibration function of the third k-space data based on the primary density calibration function and coordinates of each calibrated data point of the third k-space data, wherein the MR image of the subject is reconstructed based at least in part on the third k-space data, the weight for each calibrated data point of the third k-space data, and the density calibration function.

9. The system of claim 8, wherein the operations further includes:
determining a coil sensitivity map based on the third k-space data, the weight of each calibrated data point of the third k-space data, and the density calibration function, wherein the MR image of the subject is reconstructed based at least in part on the third k-space data, the weight of each calibrated data point of the third k-space data, the density calibration function, and the coil sensitivity map.

10. The system of claim 6, wherein the first k-space data is obtained in a radial sampling manner, the first k-space data including a first portion in a full-sampling region and a second portion in a partial-sampling region, the operations further including:
updating the first k-space data by dividing the first portion by the weight.

11. The system of claim 1, wherein the non-Cartesian sampling manner is a radial sampling manner or a spiral sampling manner.

12. The method of claim 2, wherein generating the third k-space data by calibrating the second k-space data includes:

transforming the second k-space data into an image domain to determine the intermediate FOV;
removing one or more edge portions from the original FOV in the image domain;
designating the remaining portion of the original FOV as the central portion; and
generating the third k-space data by transforming the central portion of the intermediate FOV into a k-space.

13. The method of claim 2, wherein the calibrated FOV has a shape of a rectangle or a square.

14. The method of claim 2, further including:
determining a weight for each calibrated data point of the third k-space data, wherein the MR image of the subject is reconstructed based at least in part on the third k-space data and the weight for each calibrated data point of the third k-space data.

15. The method of claim 14, wherein determining the weight for each calibrated data point of the third k-space data includes:
assigning a preliminary value for each first data point of the first k-space data;
generating an intermediate value for each second data point of the second k-space data by regridding the preliminary value for each first data point of the first k-space data;
designating the intermediate value for each second data point of the second k-space data as a value of a corresponding calibrated data point of the third k-space data;
determining a modulus of the value of each calibrated data point; and
designating the modulus as the weight of each calibrated data point of the third k-space data.

16. The method of claim 14, further including:
determining a primary density calibration function of the first k-space data;
determining, using an interpolation algorithm, a density calibration function of the third k-space data based on the primary density calibration function and coordinates of each calibrated data point of the third k-space data, wherein the MR image of the subject is reconstructed based at least in part on the third k-space data, the weight for each calibrated data point of the third k-space data, and the density calibration function.

17. The method of claim 16, further including:
determining a coil sensitivity map based on the third k-space data, the weight of each calibrated data point of the third k-space data, and the density calibration function, wherein the MR image of the subject is reconstructed based at least in part on the third k-space data, the weight of each calibrated data point of the third k-space data, the density calibration function, and the coil sensitivity map.

18. The method of claim 14, wherein the first k-space data is obtained in a radial sampling manner, the first k-space data including a first portion in a full-sampling region and a second portion in a partial-sampling region, the method further including:
updating the first k-space data by dividing the first portion by the weight.

19. The method of claim 2, wherein the non-Cartesian sampling manner is a radial sampling manner or a spiral sampling manner.

* * * * *